(12) United States Patent
Kwon et al.

(10) Patent No.: US 11,002,939 B2
(45) Date of Patent: May 11, 2021

(54) CAMERA MODULE AND METHOD FOR AUTO FOCUS THEREOF

(71) Applicant: LG ELECTRONICS INC., Seoul (KR)

(72) Inventors: Youngman Kwon, Seoul (KR); Hyungjoo Kang, Seoul (KR); Sungdu Kwon, Seoul (KR); Jayong Lee, Seoul (KR); Haejin Park, Seoul (KR); Samnyol Hong, Seoul (KR)

(73) Assignee: LG ELECTRONICS INC., Seoul (KR)

(*) Notice: Subject to any disclaimer, the term of this patent is extended or adjusted under 35 U.S.C. 154(b) by 213 days.

(21) Appl. No.: 16/300,038

(22) PCT Filed: Jun. 30, 2016

(86) PCT No.: PCT/KR2016/007039
§ 371 (c)(1),
(2) Date: Nov. 8, 2018

(87) PCT Pub. No.: WO2018/004035
PCT Pub. Date: Jan. 4, 2018

(65) Prior Publication Data
US 2019/0146179 A1 May 16, 2019

(51) Int. Cl.
G02B 7/09 (2021.01)
G03B 3/10 (2021.01)
(Continued)

(52) U.S. Cl.
CPC .............. G02B 7/09 (2013.01); G01D 5/202 (2013.01); G01R 15/18 (2013.01); G02B 7/105 (2013.01);
(Continued)

(58) Field of Classification Search
CPC .......... G01D 5/202; G01R 15/18; G02B 7/09; G02B 7/105; G02B 7/28; G02B 13/001;
(Continued)

(56) References Cited

U.S. PATENT DOCUMENTS 9,930,223 B2* 3/2018 Park .................... G02B 7/36
2007/0236577 A1* 10/2007 Ke ........................ G03B 5/00
348/208.99
(Continued)

FOREIGN PATENT DOCUMENTS

CN 101329493 12/2008
CN 101520536 9/2009
(Continued)

OTHER PUBLICATIONS

State Intellectual Property Office of the People's Republic of China Application Serial No. 201680086075.3, Office Action dated Jun. 1, 2020, 17 pages.
(Continued)

Primary Examiner — Joseph P Martinez
Assistant Examiner — Vipin Patel
(74) Attorney, Agent, or Firm — Lee, Hong, Degerman, Kang & Waimey

(57) ABSTRACT

The present invention relates to an apparatus and a method for controlling auto focus of a camera module including a voice coil motor actuator. The camera module includes a sensing unit configured to sense a movement of the lens unit and a controller configured to control the movement of the lens unit based on a sensing signal sensed by the sensing unit. If an initial operation command is received, the controller moves the lens unit to an end point of a maximum movement range. If the lens unit is positioned at the end point of the maximum movement range, the controller compares the sensing signal sensed by the sensing unit with
(Continued)

a predetermined reference signal to calculate a compensation value for an error. If a focus operation command is received, the controller can move the lens unit to a focus position based on the calculated compensation value and compensate for the focus position of the lens unit.

20 Claims, 23 Drawing Sheets

(51) Int. Cl.
    *G02B 7/105*     (2021.01)
    *G01R 15/18*     (2006.01)
    *H02K 11/225*     (2016.01)
    *H02P 7/025*     (2016.01)
    *G01D 5/20*     (2006.01)
    *G03B 13/36*     (2021.01)
    *H02K 41/035*     (2006.01)

(52) U.S. Cl.
    CPC ............... *G03B 3/10* (2013.01); *G03B 13/36* (2013.01); *H02K 11/225* (2016.01); *H02K 41/0356* (2013.01); *H02P 7/025* (2016.02)

(58) Field of Classification Search
    CPC . G02B 7/04; G02B 7/08; G03B 13/36; G03B 3/10; G03B 13/34; G03B 2205/0069; G03B 5/02; H02K 11/225; H02K 41/0356; H02K 11/215; H02P 7/025; B62D 65/18
    See application file for complete search history.

(56) References Cited

U.S. PATENT DOCUMENTS

| | | | |
|---|---|---|---|
| 2010/0128133 | A1 | 5/2010 | Lee |
| 2011/0001872 | A1 | 1/2011 | Honsho et al. |
| 2011/0158461 | A1 | 6/2011 | Ko et al. |
| 2014/0104486 | A1 | 4/2014 | Seol et al. |
| 2017/0324906 | A1* | 11/2017 | Kang ................. H04N 5/23287 |

FOREIGN PATENT DOCUMENTS

| | | |
|---|---|---|
| CN | 101743743 | 6/2010 |
| CN | 102401973 | 4/2012 |
| CN | 102455568 | 5/2012 |
| CN | 102833482 | 12/2012 |
| CN | 103986877 | 8/2014 |
| CN | 104203805 | 12/2014 |
| CN | 104429055 | 3/2015 |
| CN | 105319664 | 2/2016 |
| CN | 105453538 | 3/2016 |
| EP | 0887677 | 12/1998 |
| KR | 1020080076827 | 8/2008 |
| KR | 100869062 | 11/2008 |
| KR | 1020090008566 | 1/2009 |
| KR | 100968851 | 7/2010 |
| KR | 1020120138200 | 12/2012 |
| KR | 1020150087611 | 7/2015 |

OTHER PUBLICATIONS

PCT International Application No. PCT/KR2016/007039, Written Opinion of the International Searching Authority dated Mar. 20, 2017, 25 pages.

European Patent Office Application Serial No. 16907400.2, Search Report dated Jan. 15, 2020, 9 pages.

State Intellectual Property Office of the People's Republic of China Application Serial No. 201680086075.3, Notice of Allowance dated Nov. 25, 2020, 5 pages.

Pan, et al., "The Error Analysis of Auto-focus on Complex Surface Based on Inductive Transducer," Measurement and Experiment Technology, 2010, vol. 37, Issue 10, pp. 19-21, 4 pages.

\* cited by examiner

CAMERA MODULE AND METHOD FOR AUTO FOCUS THEREOF

CROSS-REFERENCE TO RELATED APPLICATIONS

This application is the National Stage filing under 35 U.S.C. 371 of International Application No. PCT/KR2016/007039, filed on Jun. 30, 2016, the contents of which are all hereby incorporated by reference herein in its entirety.

TECHNICAL FIELD

The present invention relates to a camera module, and more particularly, to an apparatus and method for controlling auto focus of a camera module including a voice coil motor actuator.

BACKGROUND ART

Owing to the recent technical developments, multi-functional mobile terminals having various functions intensively integrated therein are released and mobile terminals tend to be downsized and lightened to fit the mobile environments despite functional complexity and diversity.

Therefore, a camera module installed in a mobile terminal such as a mobile phone, a laptop or the like tends to be downsized owing to the ultra-downsizing and ultra-precision of lenses.

An optical system of a camera module needs an auto focus function to have a clear view of a target object that becomes a subject.

Such an auto focus function uses actuators of various types in order to move a lens module to an optical focal position. And, performance of an auto focus of a camera module can vary according to property of an actuator configured to transport a lens module.

Auto focus actuators can include actuators of various types such as a voice coil motor (VCM) actuator, a piezoelectrically driven actuator, an MEMs actuator driven by static capacitance and the like.

With respect to a camera module that employs a voice coil motor actuator, permanent magnet is located at a fixing part of the camera module and a coil is attached to a lens module to be driven, whereby a magnetic circuit is configured. Hence, a lens module is driven by Lorenz Force that flows through the coil.

Thus, the camera module of the voice coil motor type uses a scheme of obtaining a position of a lens module in a manner of applying a specific pulse to a coil and then sensing an induced current through a coil sensor. Since the camera module does not use such parts as a hole sensor, magnet and the like comparison with an existing hole sensor applied technology, it is advantageous in material cost reduction, manufacturing process simplification and product downsizing.

However, regarding the camera module of the voice coil type, if a metal closed-loop is formed near the exterior of a camera, since a reception signal of a coil sensor is distorted, it causes a problem that a focus position cannot be sensed accurately.

If a reception signal of a coil sensor is distorted, a lens module does not operate within a predetermined basic movement range and operates at the outside of the basic moving range, thereby deteriorating a focus performance of a camera.

DISCLOSURE OF THE INVENTION

Technical Tasks

An object of the present invention is to solve the aforementioned problem and other problems. Another object of the present invention is to provide a camera module capable of compensating for a focus position due to distortion and an auto focus method therefor by calculating a compensation value in a manner of comparing a signal sensed by a sensing unit with a predetermined reference signal when a lens unit is located at an end point of a maximum moving range.

When a lens unit is moved to an end point of a maximum moving range, another object of the present invention is to provide a camera module capable of promptly calculating a compensation value by moving the lens unit to an end point closest from a current position of the lens unit and an auto focus method therefor.

When a compensation value for an error is calculated, another object of the present invention is to provide a camera module capable of finding out an accurate auto focus position by calculating at least one of a first compensation value for compensating for a drive signal applied to a lens unit and a second compensation value for compensating for a signal sensed by a sensing unit and an auto focus method therefor.

When a compensation value for an error is calculated, another object of the present invention is to provide a camera module capable of finding out an accurate auto focus position by calculating at least one of a first compensation value for compensating for a gain for a current or voltage applied to a lens unit and a second compensation value for compensating for a signal sensed by a sensing unit and an auto focus method therefor.

When an error belongs to a predetermined error range, another object of the present invention is to provide a camera module capable of promptly compensating for a focus position due to distortion by not calculating a first compensation value for the error and an auto focus method therefor.

If there is no additional error, another object of the present invention is to provide a camera module capable of promptly compensating for a focus position due to distortion by not calculating a second compensation value for the additional error and an auto focus method therefor.

Another object of the present invention is to provide a camera module capable of performing auto focus using at least one selected from the group consisting of a contrast focus scheme, a laser focus scheme, and a hybrid focus scheme according to a user request or external brightness and an auto focus method therefor.

The other object of the present invention is to provide a camera module capable of preventing an error of auto focus and reducing auto focus time by reducing natural oscillation of a spring in a manner of arranging a damper between the spring and a fixed unit and an auto focus method therefor.

Technical tasks obtainable from the present invention are non-limited by the above-mentioned technical tasks. And, other unmentioned technical tasks can be clearly understood from the following description by those having ordinary skill in the technical field to which the present invention pertains.

Technical Solution

To achieve these and other advantages and in accordance with the purpose of the present invention, as embodied and broadly described, according to one embodiment, a camera module includes a sensing unit configured to sense a movement of the lens unit and a controller configured to control the movement of the lens unit based on a sensing signal sensed by the sensing unit. If an initial operation command is received, the controller moves the lens unit to an end point of a maximum movement range. If the lens unit is positioned at the end point of the maximum movement range, the controller compares the sensing signal sensed by the sensing unit with a predetermined reference signal to calculate a compensation value for an error. If a focus operation command is received, the controller can move the lens unit to a focus position based on the calculated compensation value and compensate for the focus position of the lens unit.

To further achieve these and other advantages and in accordance with the purpose of the present invention, according to a different embodiment, an auto focus method of a camera module includes the step of checking whether or not an initial operation command is received, if the initial operation command is received, moving a lens unit to an end point of a maximum movement range, if the lens unit is positioned at the end point of the maximum movement range, calculating a compensation value for an error by comparing a sensing signal sensed by a sensing unit with a predetermined reference signal, checking whether or not a focus operation command is received, if the focus operation command is received, moving the lens unit to a focus positon based on the calculated compensation value and compensating for the focus position of the lens unit.

Advantageous Effects

Effects or advantages of a camera module and an auto focus method therefor according to the present invention are described in the following.

According to at least one of embodiments of the present invention, it is able to compensate for a focus position due to distortion by calculating a compensation value in a manner of comparing a signal sensed by a sensing unit with a predetermined reference signal when a lens unit is located at an end point of a maximum moving range.

According to at least one of embodiments of the present invention, it is able to prevent an error operation of auto focus due to an external metal object, thereby enhancing picture quality.

According to at least one of embodiments of the present invention, when a lens unit is moved to an end point of a maximum moving range, it is able to promptly calculate a compensation value by moving the lens unit to an end point closest from a current position of the lens unit.

According to at least one of embodiments of the present invention, when a compensation value for an error is calculated, it is able to find out an accurate auto focus position by calculating at least one of a first compensation value for compensating for a drive signal applied to a lens unit and a second compensation value for compensating for a signal sensed by a sensing unit.

According to at least one of embodiments of the present invention, when a compensation value for an error is calculated, it is able to find out an accurate auto focus position by calculating at least one of a first compensation value for compensating for a gain for a current or voltage applied to a lens unit and a second compensation value for compensating for a signal sensed by a sensing unit.

According to at least one of embodiments of the present invention, when an error belongs to a predetermined error range, it is able to promptly compensate for a focus position due to distortion by not calculating a first compensation value for the error.

According to at least one of embodiments of the present invention, if there is no additional error, it is able to promptly compensate for a focus position due to distortion by not calculating a second compensation value for the additional error.

According to at least one of embodiments of the present invention, it is able to perform auto focus using at least one selected from the group consisting of a contrast focus scheme, a laser focus scheme, and a hybrid focus scheme according to a user request or external brightness, thereby increasing user convenience.

According to at least one of embodiments of the present invention, it is able to prevent an error of auto focus and reduce auto focus time by reducing natural oscillation of a spring in a manner of arranging a damper between the spring and a fixed unit.

It is to be understood that both the foregoing general description and the following detailed description of the present invention are exemplary and explanatory and are intended to provide further explanation of the invention as claimed.

BEST MODE

Figure 1:
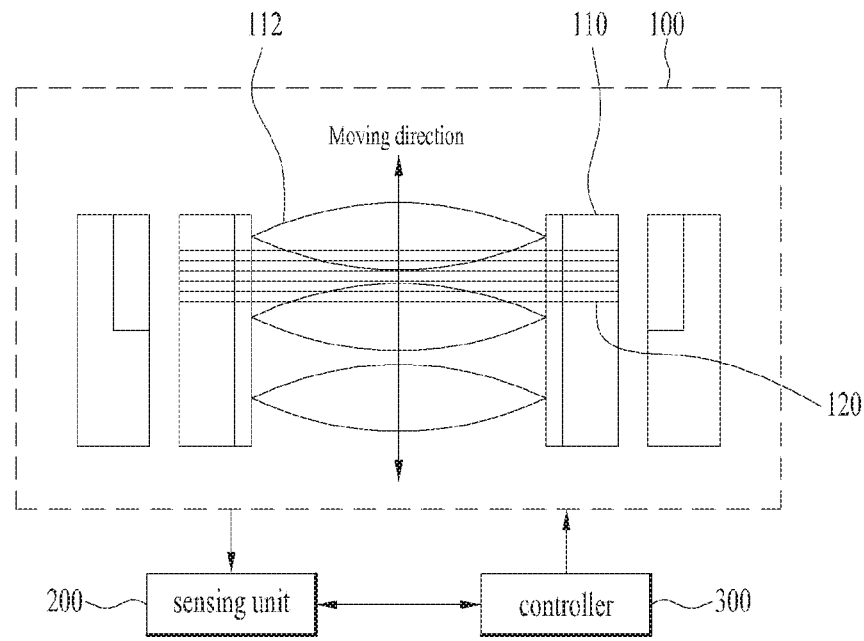
FIG. 1 is a block diagram illustrating a camera module according to one embodiment of the present invention.

Reference will now be made in detail to the preferred embodiments of the present invention, examples of which are illustrated in the accompanying drawings, to facilitate those having ordinary skill in the art to implement the invention. Wherever possible, the same reference numbers will be used throughout the drawings to refer to the same or like parts. Terminologies 'module' and 'unit' for components used in the following description are interchangeably usable in consideration of the facilitation for the specification writing but do not have distinctive meanings or roles. In describing embodiments disclosed in the present specification, if the details of the related art are determined as obscuring the gist of the embodiments disclosed in the present specification, the corresponding detailed description shall be omitted. The accompanying drawings are included to provide a further understanding of the invention, are incorporated in and constitute a part of this specification, and illustrate embodiments of the invention and together with the description serve to explain the principles of the invention. And, the accompanying drawings should be understood as including various modifications and variations of the invention that come within the scope of the appended claims and their equivalents.

Terminologies including ordinal numbers such as 1st, 2nd and the like may be used to describe various components, by which the components may be non-limited. And, the terminologies are used for the purpose of discriminating one component from other components only.

If one component is mentioned as 'connected to' or 'accessing' another component, the former component may be connected to accesses the latter component in direct. Yet, it is understood that a different component may be present in-between. On the other hand, if one component is mentioned as 'directly connected to' or 'directly accessing' another component, it is understood that a different component may is not present in-between.

Singular expression may include plural expressions unless having a clear meaning in the context.

In the present application, such a terminology as 'include', 'have' and the like intends to designate that a feature, a number, a step, an operation, a component, a part or a combination thereof disclosed in the specification exists and should be understood as not excluding possibility of existence or addition of at least one or more features, numbers, steps, operations, components, parts or combinations thereof.

A camera module described in the present specification may apply to a mobile phone, a smartphone, a laptop computer, a digital broadcast terminal, a PDA (personal digital assistants), a PMP (portable multimedia player), a navigation system, a slate PC, a tablet PC, an ultrabook, a wearable device (e.g., a smartwatch, a smart glass, an HMD (head mounted display)) and the like.

Yet, it is apparent to those skilled in the art that a configuration of a camera module according to an embodiment disclosed in this specification is applicable to such a fixed terminal as a digital TV, a desktop computer, a digital signage and the like except a case of being applicable to a mobile terminal only.

FIG. 1 is a block diagram illustrating a camera module according to one embodiment of the present invention.

As shown in FIG. 1, a camera module of the present invention can perform auto focus by moving a lens unit 110 of a camera unit 100. The camera module can include a sensing unit 200 configured to sense a movement of the lens unit 110 and a controller 300 configured to control the movement of the lens unit 110 based on a signal sensed by the sensing unit 200.

The camera unit 100 can include the lens unit 110 including lens 112, a fixed unit, a magnet, a coil 120, and the like. In this case, the fixed unit has a perforated hole formed therein and the magnet can be disposed on an inner lateral surface of the perforated hole of the fixed unit.

And, the lens unit 110 includes at least one or more lens 112 and can be linearly moved within the perforated hole of the fixed unit.

The coil 120 is deployed in a manner of surrounding the outside surface of the lens unit 110 and may move together with the lens unit 110. In this case, the coil 120 and the magnet correspond to an actuator for moving the lens unit 110. The coil and the magnet can operate the lens unit 110 so that the lens unit 110 linearly moves in up direction and down direction.

The sensing unit 200 may correspond to a coil sensor configured to sense a current or voltage varying depending on a distance from the lens unit 110. In this case, the sensing unit 200 is deployed in a manner of being apart from one side of the lens unit 110 as much as a prescribed space and can be positioned on a moving direction of the lens unit 110. Hence, the sensing unit 200 can receive the current or voltage varying depending on a distance from the coil 120 deployed on the lens unit 110 from the coil 120.

Hence, the coil 120 deployed to the lens unit 110 and the coil of the sensing unit 200 can induce a current or voltage to the coil of the sensing unit 200 from the coil 120 of the lens unit 110 by electromagnetic induction. In this case, the induced current or voltage value may vary depending on a distance between the coil of the lens unit 110 and the coil of the sensing unit 200.

Namely, the current or voltage value induced to the coil of the sensing unit 200 varies depending on a vertical distance between the sensing unit 200 and lens unit 110. Using such a displacement value, it is able to predict a moving position of the lens unit 110.

And, the controller 300 can analyze whether or not a current position corresponds to a focus position based on the moving position of the lens unit 110.

Meanwhile, the controller 300 controls movement of the lens unit 110 based on a signal sensed by the sensing unit 200. If an initial operation command is received, the controller 300 moves the lens unit 110 to an end point of a maximum movement range. When the lens unit 110 is positioned at the end point of the maximum movement range, the controller can calculate a compensation value for an error by comparing a signal sensed by the sensing unit 200 and a predetermined reference signal with each other. In this case, the maximum movement range may correspond to a moving distance between a first end point to which the lens unit 110 is able to maximally move forward and a second end point to which the lens unit 110 is able to maximally move backward.

If a focus operation command is received, the controller 300 moves the lens unit 110 to a focus position based on the calculated compensation value and may be able to compensate for the focus position of the lens unit 110.

The focus position of the lens unit 110 is compensated based on the calculated compensation value. This is because, if a metal closed-loop is formed near the outside surface of a camera, a sensing signal sensed by the sensing unit 200 is distorted and it is difficult to measure the focus position of the lens unit. In particular, if the sensing signal of the sensing unit 200 is distorted, since the lens unit 110 operates at the outside of the predetermined basic movement range without operating in the predetermined basic movement range, an error operation of an auto focus may occur.

Meanwhile, the controller 300 can calculate a compensation value for an error when power of a device including a camera module is turned on.

As a case, the controller 300 can calculate a compensation value for an error when a camera app for operating a camera module is executed.

As a different case, the controller 300 can calculate a compensation value for an error when a camera module operates and a user input for requesting focus compensation is received.

As a further different case, the controller 300 can calculate a compensation value for an error when the lens unit 110 deviates from a focus movement range. In this case, the focus movement range corresponds to a movement range of the lens unit 110 for focusing. The focus movement range may belong to a maximum movement range of the lens unit 110. As an example, if the lens unit 110 is positioned between an end point of the focus movement range and an end point of the maximum movement range, the controller 300 can calculate a compensation value for an error.

As a further different case, if a metal object is installed near the lens unit 110, the controller 300 can calculate a compensation value for an error. For example, a camera module can include a sensor configured to sense the installation of the metal object and the controller 300 can recognize whether or not the metal object is installed near the lens unit 110 according to a signal received from the sensor.

As a further different case, if the metal object installed near the lens unit 110 is removed, the controller can calculate a compensation value for an error. For example, a camera module can include a sensor configured to sense the installation of the metal object and the controller 300 can recognize whether or not the metal object installed near the lens unit 110 is removed according to a signal received from the sensor.

When the lens unit 110 is moved to an end point of a maximum movement range, the controller 300 calculates a first distance between a current location point of the lens unit 110 and a first end point of the maximum movement range, calculates a second distance between the current location point of the lens unit 110 and a second end point of the maximum movement range, and compares the first distance and the second distance with each other to move the lens unit 110 to an end point closer to the lens unit 110 among the first end point and the second end point.

When the controller 300 calculates a compensation value for an error, the controller 300 can calculate at least one of a first compensation value for compensating for a drive signal applied to the lens unit 110 and a second compensation value for compensating for a sensing signal sensed by the sensing unit 200. In this case, the controller 300 can store the first and the second compensation value in a storing unit.

For example, when the first compensation value is calculated, the controller 300 checks whether or not there is an error by comparing the sensing signal sensed by the sensing unit 200 and a predetermined reference signal with each other. If an error is checked, the controller calculates and stores the first compensation value for the error. In this case, when the controller 300 checks whether or not there is an error, if the error does not belong to a predetermined error range, the controller calculates the first compensation value for the error. If the error belongs to the predetermined error range, the controller may not calculate the first compensation value for the error.

When the second compensation value is calculated, the controller 300 compensates for a drive signal applied to the lens unit 110 based on the calculated first compensation value, applies the compensated drive signal to the lens unit 110, and checks whether or not there is an additional error by comparing the sensing signal sensed by the sensing unit 200 with the predetermined reference signal. If the additional error is checked, the controller calculates a second compensation value for the additional error and stores the calculated second compensation value.

When the controller 300 compensates for a focus position of the lens unit 110, the controller 300 moves the lens unit 110 to the focus position by compensating for a drive signal applied to the lens unit 110 based on the calculated first compensation value and may be able to compensate for the focus position of the lens unit 110 based on the calculated second compensation value.

Subsequently, when a compensation value for an error is calculated, the controller 300 can calculate at least one of a first compensation value for compensating for a gain of a current or voltage applied to the lens unit 110 and a second compensation value for compensating for a sensing signal sensed by the sensing unit 200. In this case, when a focus position of the lens unit 110 is compensated, the controller 300 moves the lens unit 100 to the focus position by compensating for the gain of the current or voltage applied to the lens unit 110 based on the calculated first compensation value and can compensate for the focus position of the lens unit 110 based on the calculated second compensation value.

Meanwhile, the camera module can further include a focus position calculating unit configured to detect a displacement value of a current or voltage from the sensing unit 200 and calculate a focus position value based on the detected displacement value. In this case, the controller 300 can control a movement of the lens unit 110 by applying a drive signal to the lens unit 110 according to the calculated focus position value.

For example, the focus position calculating unit can include a detecting unit configured to detect a displacement value of a current or voltage from the sensing unit 200 and a calculating unit configured to calculate a focus position value of the lens unit 110 based on the displacement value of the current or voltage detected by the detecting unit.

For instance, the detecting unit may include a half-wave rectifying unit, a converting unit, an amplifying unit, and a peak detecting unit. In this case, the half-wave rectifying unit is configured to rectify a frequency signal for current or voltage received from the sensing unit 200 into a half-wave signal, the converting unit is configured to convert the half-wave signal received from the half-wave rectifying unit into current or voltage, the amplifying unit is configured to amplify a frequency signal for the current or voltage converted by the converting unit, and a peak detecting unit is configured to detect a peak of the frequency signal amplified by the amplifying unit.

Meanwhile, when a drive signal is applied to the lens unit 110, the controller 300 can synthesize the drive signal corresponding to a low frequency signal with a random high frequency signal. In this case, the drive signal corresponding to the low frequency signal may include a signal component for moving the lens unit 110. The high frequency signal synthesized in the drive signal may be a signal component for sensing a moving position of the lens unit 110 and include a frequency signal higher than the drive signal. For instance, the high frequency signal synthesized in the drive signal may correspond to a signal of 100 kHz~5 MHz.

And, the focus position calculating unit detects a high frequency signal included in a drive signal and may be able to calculate a focus position value of the lens unit 110 based on the detected high frequency signal.

The camera module can further include an image sensor configured to sense an image incident via a lens 112 of the lens unit and an image signal processing unit configured to process an image signal sensed by the image sensor. In this case, the focus position calculating unit can calculate a focus position value based on the image signal processed by the image signal processing unit and a displacement value of a current or voltage received from the sensing unit 200.

As a case, the camera module can further include a distance sensor configured to sense a distance between a subject to be captured and the camera module. In this case, the focus positon calculating unit can calculate a focus positon value based on the distance from the subject sensed by the distance sensor. For example, the distance sensor can include a light irradiating unit configured to irradiate light to a subject and a light receiving unit configured to receive the light reflected from the subject. The light irradiating unit may correspond to at least one laser diode or vertical cavity surface emitting laser (VCSEL), by which the present invention may be non-limited.

As a different case, the camera module can further include a distance sensor configured to sense a distance from a subject to be captured, an image sensor configured to sense an image incident via a lens 112 of the lens unit 110, and an image signal processing unit configured to process an image signal sensed by the image sensor. In this case, the focus positon calculating unit can calculate a focus positon value based on an image signal processed by the image signal processing unit and a displacement value of current or voltage received from the sensing unit. Or, the focus positon calculating unit can calculate a focus positon value based on the distance from the subject sensed by the distance sensor.

As a further different case, the camera module can further include an illumination sensor configured to sense external brightness. In this case, if the external brightness sensed by the illumination sensor is equal to or greater than a reference value, the focus position calculating unit calculates a focus position value based on an image signal processed by the image signal processing unit and a displacement value of current or voltage received from the sensing unit. If the external brightness sensed by the illumination sensor is less than a reference value, the focus position calculating unit calculates a focus position value based on a distance from a subject sensed by the distance sensor. For example, the reference value for the external brightness may correspond to about 100 lux.

If the external brightness sensed by the illumination sensor is less than a reference value, the focus position calculating unit can provide a display screen with a notification message notifying that a focusing scheme is switching to a laser focusing scheme for calculating a focus position using a distance from a subject from a contrast focusing scheme for calculating a focus position using image contrast of the subject.

If a reference value configuration request signal for external brightness is received, the focus position calculating unit provides a reference value configuration window to a display screen. If a reference value configuration completion signal is received via the reference value configuration window, the focus position calculating unit can change a reference value for the external brightness according to a configuration completed configuration value.

Subsequently, if an auto focus configuration request signal is received, the focus position calculating unit provides an auto focus configuration window to the display screen. If an auto focus configuration completion signal is received via the auto focus configuration window, the focus position calculating unit can calculate a focus position value according to a configuration completed auto focus scheme. In this case, the auto focus configuration window can include a contrast focus item for calculating a focus position using image contrast of a subject, a laser focus item for calculating a focus position using a distance from the subject, and a hybrid focus item for calculating a focus position using one of a contrast focus scheme for calculating a focus position using image contrast of a subject and a laser focus scheme for calculating a focus position using a distance from the subject.

As mentioned in the foregoing description, according to the present invention, when the lens unit 110 is positioned at an end point of a maximum movement range, it may be able to compensate for a focus position due to distortion by calculating a compensation value in a manner of comparing a sensing signal sensed by the sensing unit 200 and a predetermined reference signal with each other.

In particular, according to the present invention, it is able to prevent an error operation of an auto focus due to an external metal object, thereby increasing picture quality.

Figure 2:
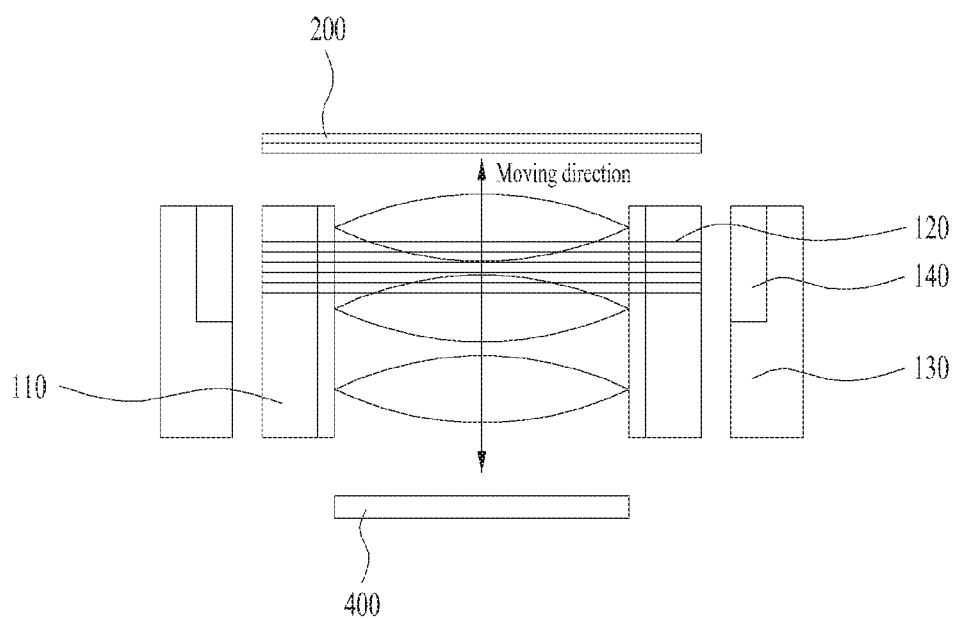
FIG. 2 is a cross-sectional diagram for explaining deployments of a camera module and a sensing unit shown in FIG. 1.

FIG. 2 is a cross-sectional diagram for explaining deployments of a camera module and a sensing unit shown in FIG. 1.

As shown in FIG. 2, the camera module can perform an auto focus by moving the lens unit 110. The camera module can include a fixed unit 130, a magnet 140, a lens unit 110, and a coil 120.

In this case, the fixed unit 130 may have a perforated hole formed in a central region of the fixed unit 130. The magnet 140 may be disposed on an inner lateral side of the perforated hole of the fixed unit 130. For instance, there may be a single magnet 140. In some cases, a multitude of magnets 140 may be provided. In case of a multitude of the magnets 140 are provided, the magnets 140 may be disposed in a manner of being space apart from each other in equal intervals. In some cases, the magnets 140 may be disposed in different intervals.

A multitude of the magnets 140 may be disposed symmetric to an axis of coordinates, which passes through a center of the perforated hole of the fixed unit 130. The reason for disposing a multitude of the magnets 140 symmetric to the axis of the coordinates, which passes through the center of the perforated hole of the fixed unit 130, is to stably detect a displacement value of current or voltage according to the movement of the lens unit 110 without external influence.

The lens unit 110 includes at least one lens 112 and is able to linearly move within the perforated hole of the fixed unit 130.

The coil 120 is disposed to enclose an outer surface of the lens unit 110 so as to be movable together with the lens unit 110. In this case, the coil 120 and the magnet 140 configure an actuator for moving the lens unit 110 and are able to drive the lens unit 110 to linearly move in top or bottom direction.

The sensing unit 200 may correspond to a coil sensor configured to sense a current or voltage, which varies according to a distance from the from the lens unit 110. In this case, the sensing unit 200 is disposed by being spaced apart from one side of the lens unit 110 by a predetermined interval and can be located on a line of a moving direction of the lens unit 110. Hence, the sensing unit 200 can receive current or voltage, which varies according to a distance from the coil 120 disposed on the lens unit 110, from the coil 120.

Hence, the coil 120 deployed to the lens unit 110 and the coil of the sensing unit 200 can induce a current or voltage to the coil of the sensing unit 200 from the coil 120 of the lens unit 110 by electromagnetic induction. In this case, the induced current or voltage value may vary depending on a distance between the coil 120 of the lens unit 110 and the coil of the sensing unit 200.

Namely, the current or voltage value induced to the coil of the sensing unit 200 varies depending on a vertical distance between the sensing unit 200 and lens unit 110. Using such a displacement value, it is able to predict a moving position of the lens unit 110.

Moreover, the winding number of the coil of the sensing unit 200 may be different from that of the coil 120 disposed on the lens unit 110. For instance, the winding number of the coil of the sensing unit 200 may be smaller than that of the coil 120 disposed on the lens unit 110. The reason why the winding number of the coil of the sensing unit 200 is smaller than that of the coil 120 disposed on the lens unit 110 is that an overall size of the camera module can be reduced and that a frequency signal for current or voltage induced to the sensing unit 200 can be amplified.

In some cases, the winding number of the coil of the sensing unit 200 may be equal to that of the coil 120 disposed on the lens unit 110.

The camera module of the present invention may further include a spring (not depicted) configured to provide an elastic force according to the movement of the lens unit 100 by being connected between the fixed unit 130 and the lens unit 110.

Herein, a damper may be disposed between the spring and the fixed unit 130. In particular, the damper may be disposed adjacent to a connecting end of the spring and the fixed unit 130. The reason why the damper is provided is to suppress the natural oscillation of the spring. Hence, by reducing the hysteresis properties, it is able to prevent the error of the auto focus.

Subsequently, the sensing unit 200 is disposed on one side of the lens unit 110 and an image sensor 400 can be disposed on another side of the lens unit 110 on the basis of the lens unit 110. In this case, the image sensor 400 can sense an image irradiated via a lens 112 of the lens unit 110.

In some cases, a coil sensor corresponding to the sensing unit 200 and the image sensor 400 can be positioned together at one side of the lens unit 110 on the basis of the lens unit 110. In particular, the coil sensor corresponding to the sensing unit 220 and the image sensor 400 can be positioned together in the same direction from the view of the lens unit 110.

Meanwhile, since the sensing unit 200 of the present invention corresponds to the coil sensor, if a metal closed-loop is formed near the exterior of a camera, a signal sensed by the sensing unit 200 is distorted. As a result, it causes a problem that a focus position cannot be sensed accurately. If the signal sensed by the sensing unit 200 is distorted, the lens unit 110 does not operate within a predetermined basic movement range and operates at the outside of the basic movement range. Hence, an error operation of auto focus may occur.

If an initial operation command is received, the controller moves the lens unit 110 to an end point of a maximum movement range. When the lens unit 110 is positioned at the end point of the maximum movement range, the controller can calculate a compensation value for an error by comparing a signal sensed by the sensing unit 200 and a predetermined reference signal with each other. In this case, the maximum movement range may correspond to a moving distance between a first end point to which the lens unit 110 is able to maximally move forward and a second end point to which the lens unit 110 is able to maximally move backward. If a focus operation command is received, the controller moves the lens unit 110 to a focus position based on the calculated compensation value and may be able to compensate for the focus position of the lens unit 110.

Figure 3:
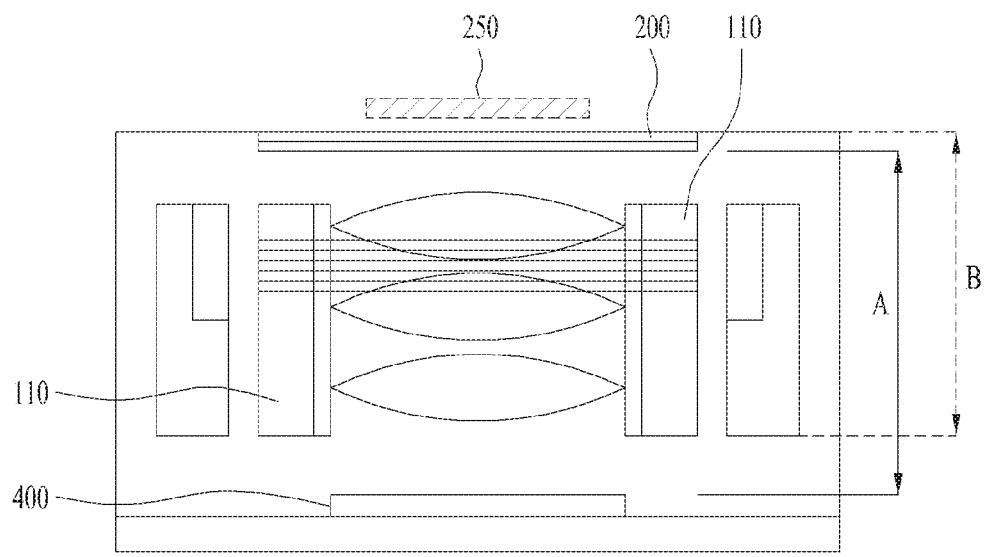
FIG. 3 is a diagram illustrating a focus error operation of a camera module due to an external metal object.
Figure 4:
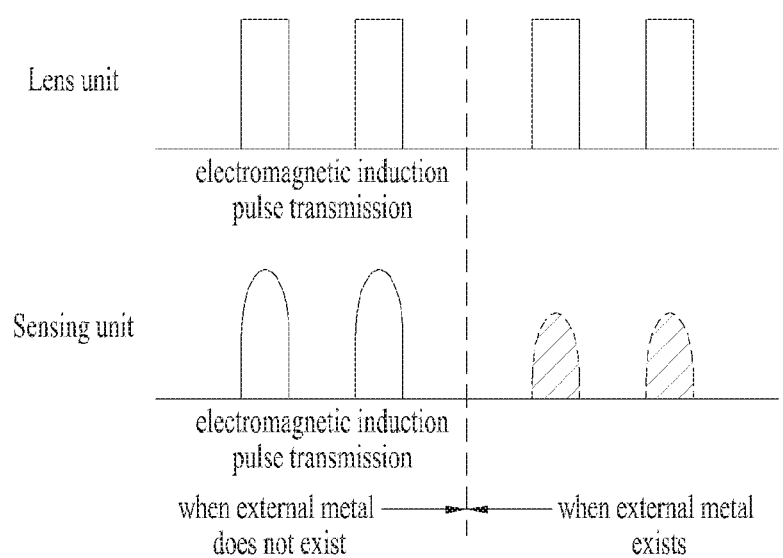
FIG. 4 is a graph for distortion of a sensing signal distorted by an external metal.

FIG. 3 is a diagram illustrating a focus error operation of a camera module due to an external metal object and FIG. 4 is a graph for distortion of a sensing signal distorted by an external metal object.

As shown in FIG. 3, a camera module can include a sensing unit 200 corresponding to a coil sensor disposed on the front side of a lens unit 110 and an image sensor 400 disposed on the rear side of the lens unit 110.

Such an external metal object 250 as a metal closed-loop can be formed near the coil sensor of the sensing unit 200. If the external metal object 250 is formed near the sensing unit 200, a sensing signal of the sensing unit 200 can be distorted. If the sensing signal of the sensing unit 200 is distorted, the lens unit 110 operates not in a predetermined basic movement rage (A region) but in a distorted movement range (B region). Hence, an error operation of auto focus occurs, thereby deteriorating focus performance.

As shown in FIG. 4, when an external metal object does not exist, if a drive signal is applied to the lens unit 110, the lens unit 110 moves and the sensing unit 200 receives an electromagnetic induction pulse, which varies according to the movement of the lens unit 110, from the lens unit 110 by the electromagnetic induction. By doing so, it is able to know a current position of the lens unit 110.

On the contrary, if there exists an external metal object, distortion occurs on an electromagnetic induction pulse received from the lens unit 110. Hence, it may be difficult for the sensing unit 200 to measure a current position of the lens unit 110.

A camera module according to the present invention calculates a compensation value capable of compensating for distortion of an electromagnetic induction pulse irrespective of whether or not there is an external metal object and compensates for a focus position of the lens unit based on the compensation value, thereby increasing auto focus performance.

Figure 5:
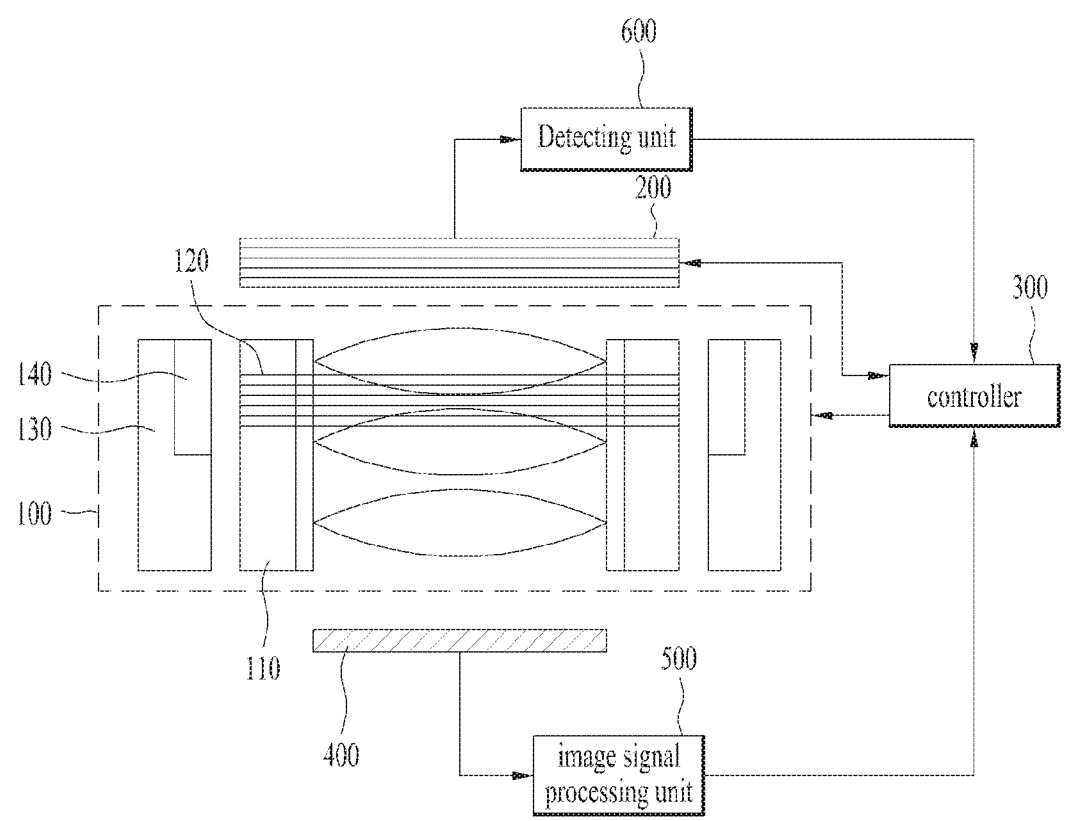
FIG. 5 is a block diagram for explaining an auto focus control procedure of a camera module.
Figure 6:
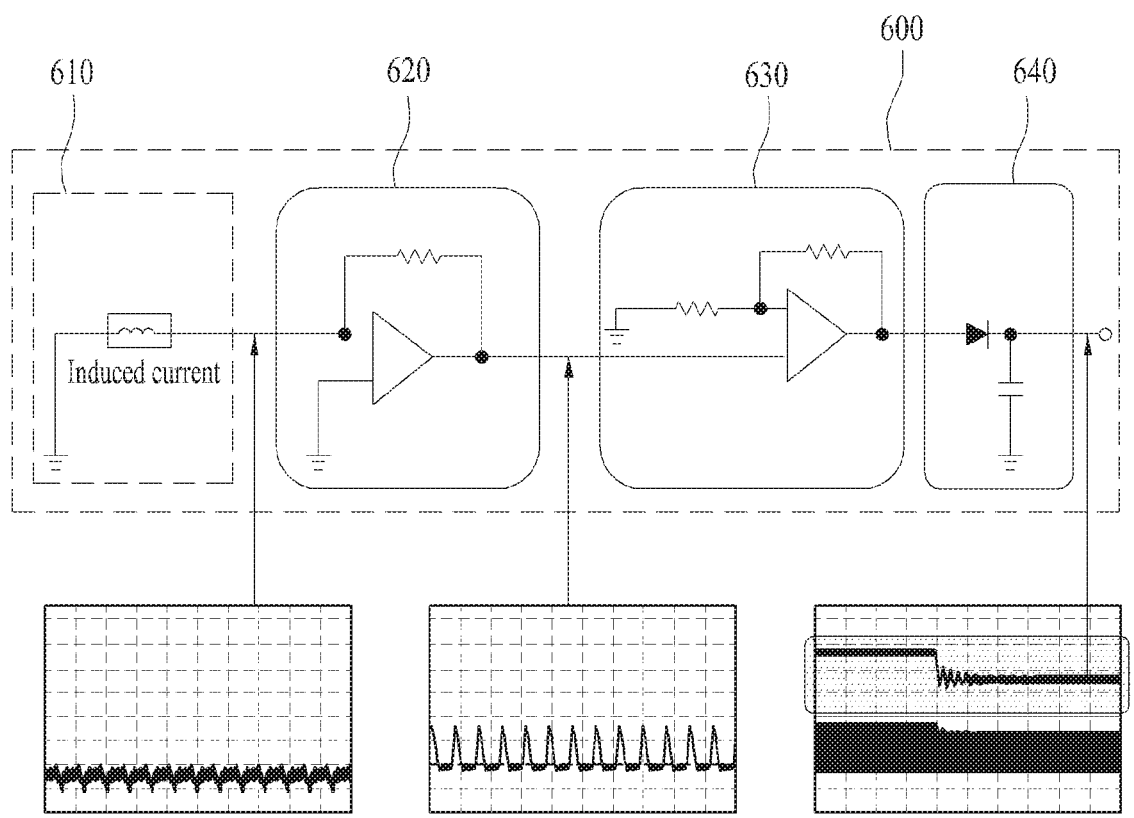
FIG. 6 is a detail diagram of a detection unit shown in FIG. 5.

FIG. 5 is a block diagram for explaining an auto focus control procedure of a camera module and FIG. 6 is a detail diagram of a detection unit shown in FIG. 5.

As shown in FIG. 5, a camera module can include a camera unit 100 including a fixed unit 130, a magnet 140, a lens unit 110, and a coil 120, a sensing unit 200, a controller 300, an image sensor 400, an image signal processing unit 500, and a detecting unit 600.

In this case, the fixed unit 130 may have a perforated hole formed in a central region of the fixed unit 130. The magnet 140 may be disposed on an inner lateral side of the perforated hole of the fixed unit 130.

The lens unit 110 includes at least one lens 112 and is able to linearly move within the perforated hole of the fixed unit 130.

The coil 120 is disposed to enclose an outer surface of the lens unit 110 so as to be movable together with the lens unit 110. In this case, the coil 120 and the magnet 140 configure an actuator for moving the lens unit 110 and are able to drive the lens unit 110 to linearly move in top or bottom direction.

The sensing unit 200 may correspond to a coil sensor configured to sense a current or voltage, which varies according to a distance from the lens unit 110. In this case, the sensing unit 200 is disposed by being spaced apart from one side of the lens unit 110 by a predetermined interval and can be located on a line of a moving direction of the lens unit 110. Hence, the sensing unit 200 can receive current or voltage, which varies according to a distance from the coil 120 disposed on the lens unit 110, from the coil 120.

Hence, the coil 120 deployed to the lens unit 110 and the coil of the sensing unit 200 can induce a current or voltage to the coil of the sensing unit 200 from the coil 120 of the lens unit 110 by electromagnetic induction. In this case, the induced current or voltage value may vary depending on a distance between the coil 120 of the lens unit 110 and the coil of the sensing unit 200.

And, the detecting unit 600 can detect a displacement value of a current or voltage from the sensing unit 200. In this case, as shown in FIG. 6, the detecting unit 600 may include a half-wave rectifying unit 610, a converting unit 620, an amplifying unit 630, and a peak detecting unit 640. In this case, the half-wave rectifying unit 610 is configured to rectify a frequency signal for current or voltage received from the sensing unit 200 into a half-wave signal, the converting unit 620 is configured to convert the half-wave signal received from the half-wave rectifying unit into current or voltage, the amplifying unit 630 is configured to amplify a frequency signal for the current or voltage converted by the converting unit 620, and a peak detecting unit 640 is configured to detect a peak of the frequency signal amplified by the amplifying unit 630.

Hence, the controller 300 can calculate a current position of the lens unit 110 based on a displacement value of current or voltage detected by the detecting unit 600. In particular, since the current or voltage induced to the coil of the sensing unit 200 varies according to a vertical distance between the sensing unit 200 and the lens unit 110, the controller 300 is able to predict a moving position of the lens unit using the displacement value.

Subsequently, the sensing unit 200 is disposed on one side of the lens unit 110 and the image sensor 400 can be disposed on another side of the lens unit 110 on the basis of the lens unit 110. In this case, the image sensor 400 can sense an image irradiated via a lens 112 of the lens unit 110. And, the image signal processing unit 500 can process an image signal sensed by the image sensor 400.

Subsequently, the controller 300 measures a current position of the lens unit 110 based on the image signal processed by the image signal processing unit 500 and the displacement value of the current or voltage detected by the detecting unit 600 and may be able to check whether or not the measured current position of the lens unit 110 corresponds to a focus position.

Meanwhile, if an initial operation command is received, the controller 300 moves the lens unit 110 to an end point of a maximum movement range. When the lens unit 110 is positioned at the end point of the maximum movement range, the controller 300 can calculate a compensation value for an error by comparing a signal sensed by the sensing unit 200 and a predetermined reference signal with each other. In this case, the maximum movement range may correspond to a moving distance between a first end point to which the lens unit 110 is able to maximally move forward and a second end point to which the lens unit 110 is able to maximally move backward. If a focus operation command is received, the controller 300 moves the lens unit 110 to a focus position based on the calculated compensation value and may be able to compensate for the focus position of the lens unit 110.

Figure 7:
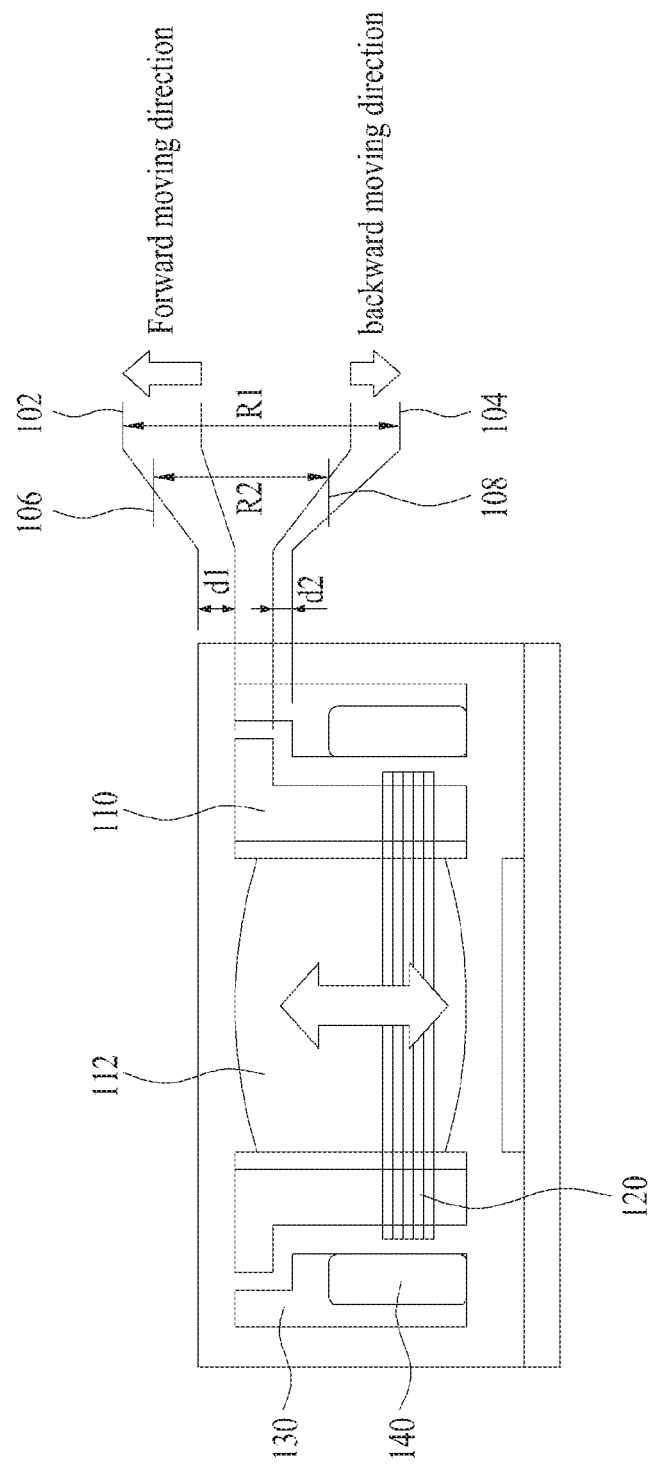
FIG. 7 is a block diagram for explaining an auto focus compensation procedure of a camera module.
Figure 8:
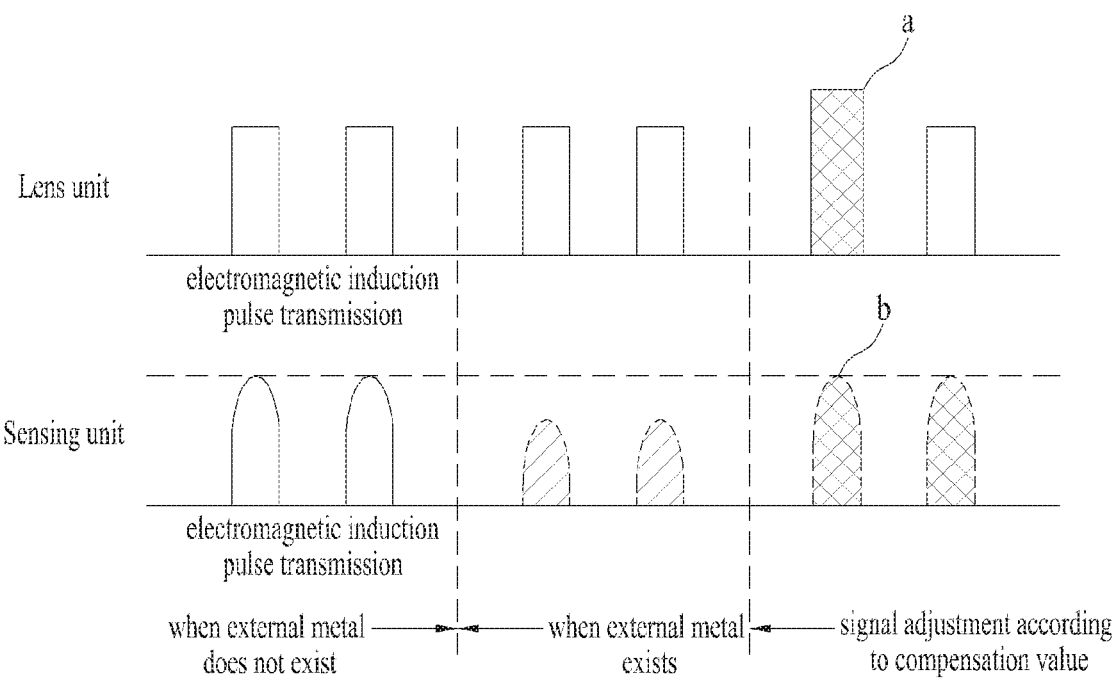
FIG. 8 is a graph for explaining an auto focus compensation procedure of a camera module.
Figure 9:
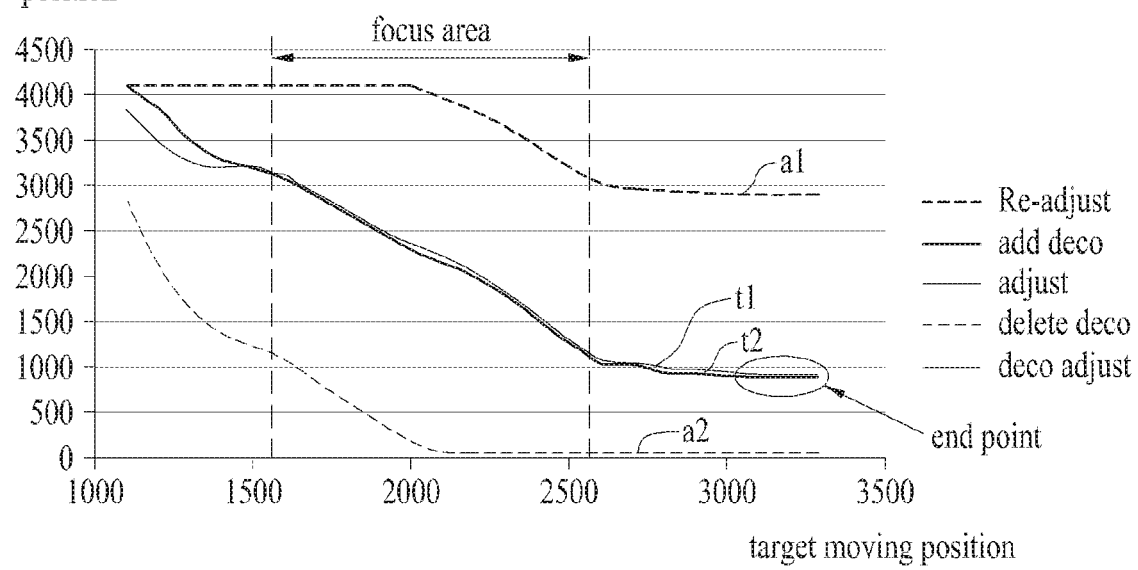
FIG. 9 is a graph for a compensation signal according to an auto focus compensation procedure of a camera module.

FIG. 7 is a block diagram for explaining an auto focus compensation procedure of a camera module, FIG. 8 is a graph for explaining an auto focus compensation procedure of a camera module, and FIG. 9 is a graph for a compensation signal according to an auto focus compensation procedure of a camera module.

As shown in FIG. 7, if an initial operation command is received, the controller can move the lens unit 110 to an end point 102/104 of a maximum movement range (R1) to prevent a signal from being distorted by an external metal object. In this case, the maximum movement range R1 may correspond to a moving distance between a first end point 102 to which the lens unit 110 is able to maximally move forward and a second end point to which the lens unit 110 is able to maximally move backward.

The first end point 102 and the second end point 104 of the maximum movement range R1 correspond to mechanically not changing points. When the camera module is designed, a signal received from the lens unit 110 positioned at the end point of the maximum movement range R1 can be configured as a reference signal in advance. Hence, although a sensing signal sensed by the sensing unit is distorted by an external metal, if a compensation value for an error is calculated by comparing the sensing signal and the reference signal with each other when the sensing unit 110 is positioned at the end point, it is able to compensate for the signal distortion in a focus area.

In particular, when the lens unit 110 is positioned at the end point of the maximum movement range, it is able to calculate a compensation value for an error by comparing a sensing signal sensed by the sensing unit and a predetermined reference signal with each other.

When the lens unit 110 is moved to an end point of the maximum movement range R1 to calculate a compensation value, the controller calculates a first distance (d1) between a current position point of the lens unit 110 and the first end point 102 of the maximum movement range R1, calculates a second distance (d2) between the current position point of the lens unit 110 and the second end point 104 of the maximum movement range R1, and compares the first distance (d1) and the second distance (d2) with each other to move the lens unit 110 to a point closer to the lens unit 110 among the first end point 102 and the second end point 104 of the maximum movement range R1. The reason why the lens unit 110 is moved to the end point closer to the lens unit is to quickly calculate a compensation value.

When a compensation value for an error is calculated, the controller calculates at least one of a first compensation value for compensating for a drive signal applied to the lens unit 110 and a second compensation value for compensating for a sensing signal sensed by the sensing unit and stores the calculated first and second compensation values in a storing unit.

In some cases, when a compensation value for an error is calculated, the controller calculates at least one of a first compensation value for compensating for a gain of a current or voltage applied to the lens unit 110 and a second compensation value for compensating for a sensing signal sensed by the sensing unit and stores the calculated first and second compensation values in a storing unit.

When the first compensation value is calculated, the controller compares the sensing signal sensed by the sensing unit and a predetermined reference signal with each other to check whether or not there is an error. If an error is checked, the controller calculates the first compensation value for the error and stores the calculated first compensation value. If no error is checked, the controller may be able to immediately perform an auto focus operation without calculating the first compensation value for an error.

When the controller checks whether or not there is an error, if an error does not belong to a predetermined error range, the controller calculates the first compensation value for the error. If an error belongs to the predetermined error range, the controller may be able to immediately perform an auto focus operation without calculating the first compensation value for the error. When an error belongs to the predetermined error range, the reason why the controller does not calculate the first compensation value for the error is to quickly perform an auto focus operation.

When the second compensation value is calculated, the controller compensates for a drive signal applied to the lens unit 110 based on the calculated first compensation value, applies the compensated drive signal to the lens unit 110, and compares the sensing signal sensed by the sensing unit and the predetermined reference signal with each other to check whether or not there is an additional error. If an additional error is checked, the controller calculates a second compensation value for the additional error and stores the calculated second compensation value. The reason why the additional error is checked is to minutely adjust the sensing signal sensed by the sensing unit and delicately and accurately compensate for a focus position of the lens unit.

Subsequently, if a focus operation command is received, the controller moves the lens unit 110 to a focus position based on the calculated compensation value to compensate for the focus position of the lens unit 110. In particular, if the focus operation command is received, the controller moves the lens unit 110 within a focus movement range R2 to find out a focus position. In this case, the focus movement range R2 corresponds to a movement range in which the lens unit 110 moves for focusing. The focus movement range R2 corresponds to a distance between a first end point 106 and a second end point 108 of the focus movement range R2 and may belong to the maximum movement range R1 of the lens unit 110.

In particular, when a focus position of the lens unit 110 is compensated, the controller compensates for a drive signal applied to the lens unit 110 based on the calculated first compensation value, moves the lens unit 110 to the focus position, and may be able to compensate for the focus position of the lens unit 110 based on the calculated second compensation value.

In some cases, when the controller compensates for a focus position of the lens unit 110, the controller compensates for a gain of a current or voltage applied to the lens unit 100 based on the calculated first compensation value, moves the lens unit 100 to the focus position, and may be able to compensate for the focus position of the lens unit 100 based on the calculated second compensation value.

As shown in FIG. 8, when an external metal object does not exist, if a drive signal is applied to the lens unit 110, the lens unit 110 moves and the sensing unit 200 receives an electromagnetic induction pulse, which varies according to the movement of the lens unit 110, from the lens unit 110 by electromagnetic induction and may be able to know a current position of the lens unit 110.

On the contrary, if an external metal object exists, the electromagnetic induction pulse received from the lens unit 110 is distorted. As a result, it may be difficult to measure a current position of the lens unit 110.

The camera module according to the present invention calculates a compensation value capable of compensating for a distortion of an electromagnetic induction pulse irrespective of whether or not there exists an external metal object and compensates for a focus position of the lens unit based on the calculated compensation value, thereby enhancing auto focus performance.

In particular, when a focus position of the lens unit is compensated, the camera module of the present invention compensates for a drive signal (a) applied to the lens unit based on a calculated first compensation value, moves the lens unit to a focus position, compensates for a sensing signal (b) sensed by the sensing unit based on a second compensation value, and compensates for the focus position of the lens unit.

In some cases, when the camera module of the present invention compensates for a focus position of the lens unit, the camera module compensates for a gain (a) of a current or voltage applied to the lens unit based on the calculated first compensation value, moves the lens unit to the focus position, and may be able to compensate for the focus position of the lens unit by compensating for the sensing signal (b) sensed by the sensing unit based on the calculated second compensation value.

As shown in FIG. 9, the camera module of the present invention calculates a compensation value for an error and can compensate for an auto focus position irrespective of whether or not there exists an external metal object. By doing so, it may be able to prevent an error operation of an auto focus capable of being occurred by an external metal object, thereby enhancing picture quality.

According to the present invention, when an external metal object is additionally installed or an installed external metal object is removed, it may be also able to prevent an error operation of an auto focus, thereby enhancing reliability.

For example, FIG. 9 is a graph showing a target moving position for a current moving positon of the lens unit. A focus area corresponds to a focus movement range of the lens unit for focusing and the focus area may belong to the maximum movement range. Hence, if an error between a current movement value and a target movement value belongs to a specific error range in the focus area, the lens unit can perform an accurate focus operation.

However, when an external metal object is installed in the camera module, if a target movement value corresponds to t1, an actual movement value can be changed to a1 due to a signal distortion. Hence, according to the present invention, the lens unit is moved to an end point of the maximum movement range where the lens unit is not mechanically changed, an error due to the signal distortion (an error between the current movement value a1 and the target movement value t1) is analyzed at the end point of the maximum movement range, and a compensation value for the error can be calculated in the focus area. Subsequently, if a focus position of the lens unit is compensated in the focus area based on a calculated compensation value, the lens unit can be adjusted to a compensation movement value t2 which has little error for the target movement value t1.

When a metal object is removed from the camera module, if a target movement value corresponds to t1, an actual movement value can be changed to a2 due to a signal distortion. Hence, according to the present invention, the lens unit is moved to an end point of the maximum movement range where the lens unit is not mechanically changed, an error due to the signal distortion (an error between the current movement value a2 and the target movement value t1) is analyzed at the end point of the maximum movement range, and a compensation value for the error can be calculated in the focus area. Subsequently, if a focus position of the lens unit is compensated in the focus area based on a calculated compensation value, the lens unit can be adjusted to a compensation movement value t2 which has little error for the target movement value t1.

In particular, according to the present invention, it is able to prevent an error operation of an auto focus due to an external metal object, thereby enhancing picture quality.

FIGS. 10 to 15 are diagrams for explaining a focus compensation command according to the present invention.

As shown in FIGS. 10 to 15, according to the present invention, if an initial operation command for compensating for a focus is received, it may be able to calculate a compensation value due to a signal distortion.

Figure 10:
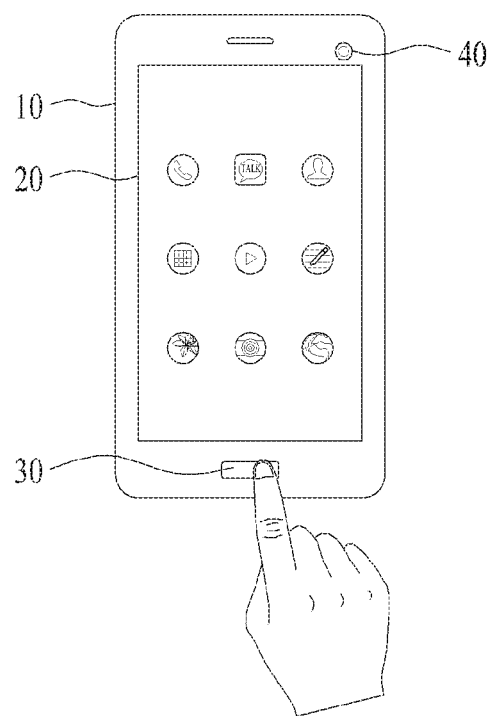
FIGS. 10 to 15 are diagrams for explaining a focus compensation command according to the present invention.

As an example, as shown in FIG. 10, the controller according to the present invention can calculate a compensation value when power of a device including a camera 40 is turned on. In particular, if a user input for selecting a power button 30 of the device 10 including the camera 40 is received, the controller can perform an operation for calculating a compensation value. In this case, the operation for calculating the compensation value may correspond to an operation of moving the lens unit to an end point of a maximum movement range, comparing a sensing signal sensed by the sensing unit and a predetermined reference signal with each other when the lens unit is positioned at the end point of the maximum movement range, and calculating a compensation value for an error. And, if a focus operation command is received, the controller moves the lens unit to a focus position based on the calculated compensation value and may be able to compensate for the focus position of the lens unit.

Figure 11:
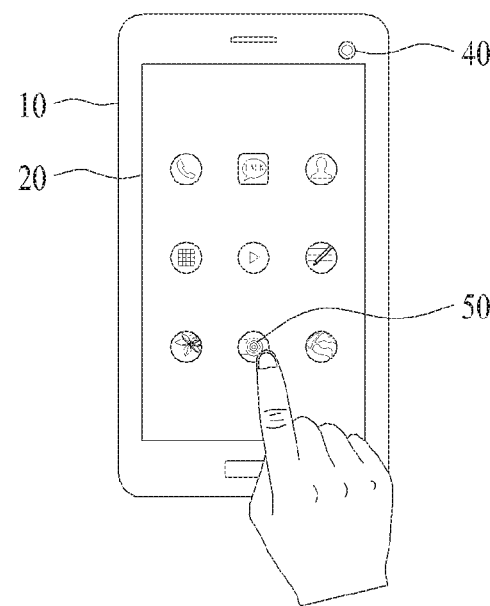

As a different example, as shown in FIG. 11, if a camera app for operating the camera 400 is executed, the controller of the present invention can calculate a compensation value. In particular, if a user input for selecting a camera app execution icon 50 is received on a display screen 20 of the device 10 including the camera 40, the controller can perform an operation for calculating a compensation value.

Figure 12:
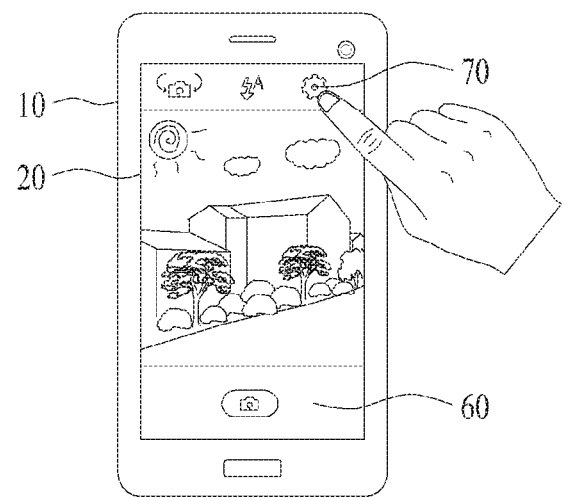

As a further different example, as shown in FIG. 12, if a camera is executed and a user input for requesting focus compensation is received, the controller of the present invention can calculate a compensation value. In particular, if a camera app is executed, the device 10 including the camera displays a camera execution screen 60 on the display screen 20. If a user input for selecting a focus compensation button 70 is received on the camera execution screen 60, the controller can perform an operation for calculating a compensation value.

Figure 13:
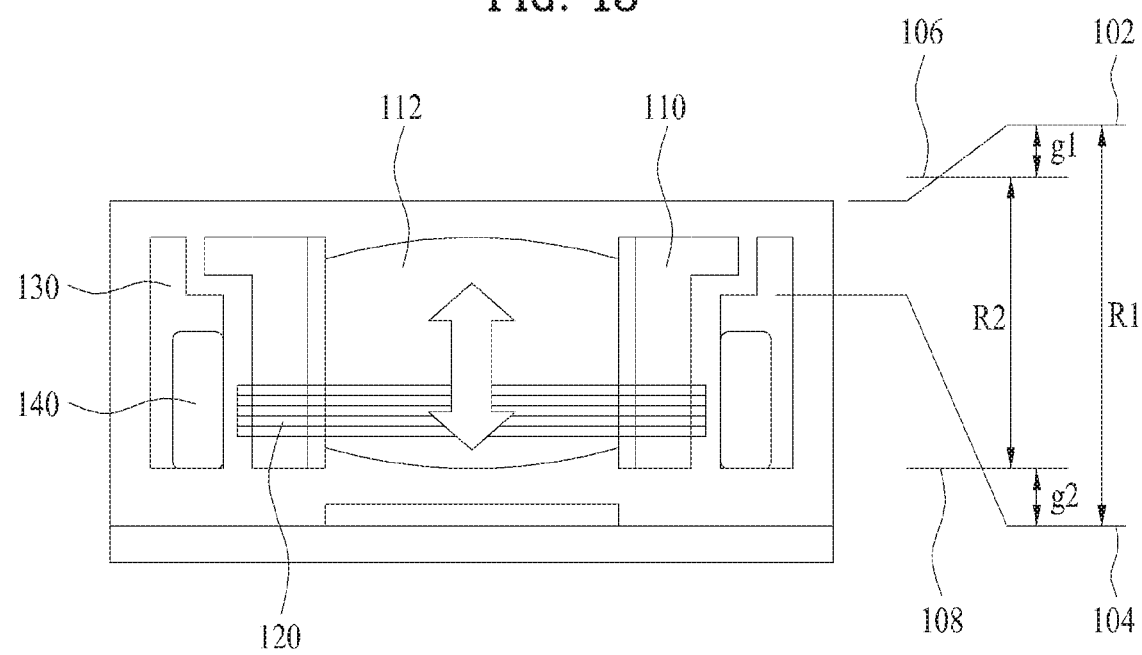

As a further different example, as shown in FIG. 13, if the lens unit 110 deviates from a focus movement range (R2), the controller of the present invention can calculate a compensation value. In this case, the focus movement range (R2) corresponds to a movement range in which the lens unit 100 moves for focusing and may belong to the maximum movement range (R1) of the lens unit 110. In particular, if the lens unit 100 is positioned between an end point 106/108 of the focus movement range (R2) and an end point 102/104 of the maximum movement range (R1), the controller can calculate a compensation value. For example, if the lens unit 110 is positioned at a first gap (g1) between a first end point 106 of the focus movement range (R2) and a first end point 102 of the maximum movement range (R1) or is positioned at a second gap (g2) between a second end point 108 of the focus movement range (R2) and a second end point 104 of the maximum movement range (R1), the controller can calculate a compensation value.

Figure 14:
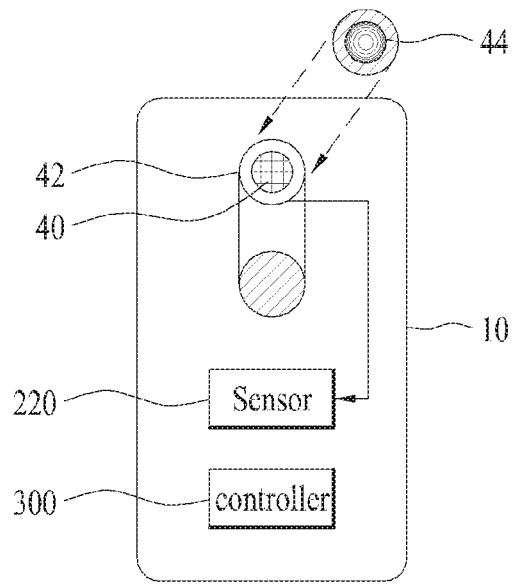

As a further different example, as shown in FIG. 14, if a metal object 44 is installed in the vicinity of 42 the camera 40, the controller of the present invention can calculate a compensation value. In this case, according to the present invention, it may be able to include a sensor 220 configured to sense attach/detach of the metal object 44. The controller 300 can recognize whether or not the metal object 44 is installed in the vicinity of 42 the camera 40 according to a signal received from the sensor 220.

Figure 15:
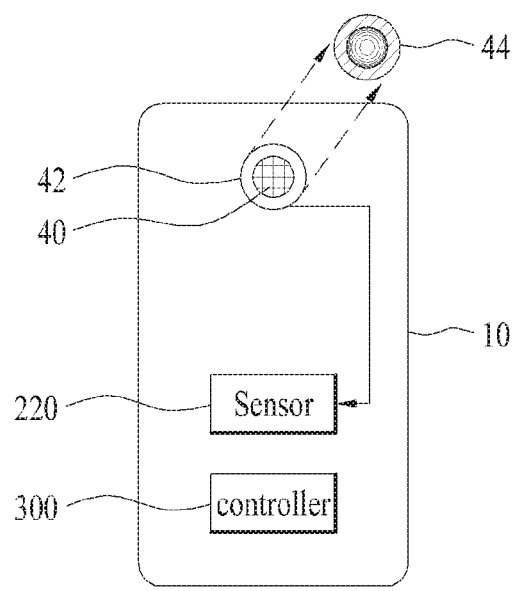

As a further different example, as shown in FIG. 15, if a metal object 44 near 42 the camera 40 is removed from the camera 40, the controller of the present invention can calculate a compensation value. In this case, according to the present invention, it may be able to include a sensor 220 configured to sense attach/detach of the metal object 44. The controller 300 can recognize whether or not the metal object 44 installed in the vicinity of the camera 40 is removed from the camera 40 according to a signal received from the sensor 220.

As mentioned in the foregoing description, according to the present invention, it is able to calculate a compensation value due to a signal distortion according to various types of focus compensation commands, thereby preventing a focus error operation and providing user convenience.

Figure 16:
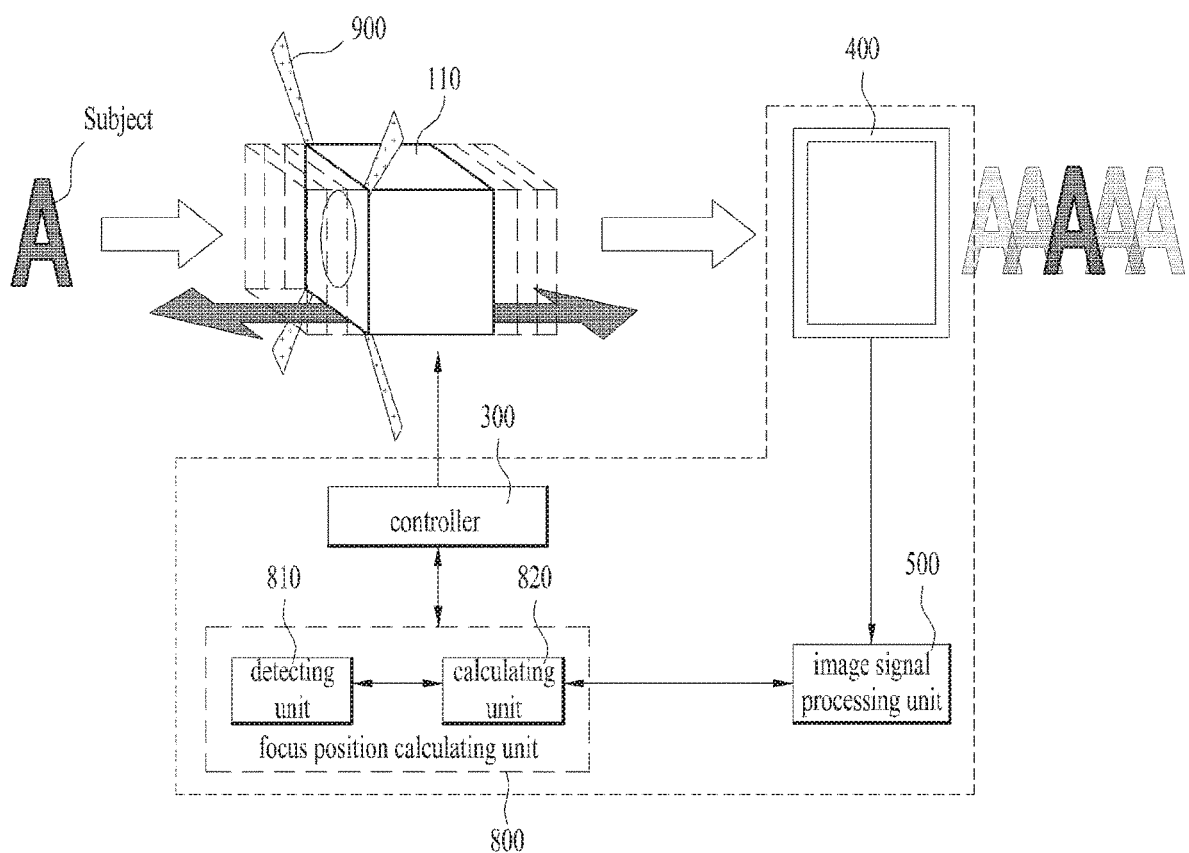
FIG. 16 is a block diagram for a camera module according to a different embodiment of the present invention.

FIG. 16 is a block diagram for a camera module according to a different embodiment of the present invention.

As shown in FIG. 16, a camera module of the present invention includes a sensing unit for sensing a movement of a lens unit 110. In this case, the camera module may use a contrast focus scheme that calculates a focus position using image contrast of a subject.

The camera module using the contrast focus scheme can include an image sensor 400, an image signal processing unit 500, a focus position calculating unit 800, and a controller 300. In this case, the image sensor 400 senses an image of a subject incident via a lens of the lens unit 110 which moves in a manner of being connected with a spring 900. The image signal processing unit 500 processes an image signal sensed by the image sensor 400. The focus position calculating unit 800 can calculate a focus position value based on the image signal processed by the image signal processing unit 500 and a displacement value of a current or voltage received from a coil sensor corresponding to the sensing unit.

For example, the focus position calculating unit 800 can include detecting unit 810 configured to detect a displacement value of a current or voltage received from a coil sensor and a calculating unit 820 configured to calculate a focus position value of the lens unit 110 based on the image signal processed by the image signal processing unit 500 and the displacement value of the current or voltage detected by the detecting unit 810. The calculating unit 820 compares contrasts of signal-processed images with each other, extracts an image of highest contrast from the images, and determines a position of a moving unit 200 at which the extracted image is captured as an optimized focus position.

Subsequently, if an initial operation command for focus compensation is received, the controller 300 calculates a compensation value due to a signal distortion. If a focus operation command is received, the controller controls the focus position calculating unit 800 to calculate a focus position value, moves the lens unit 110 to a focus position based on the calculated compensation value and the focus position value, and compensates for the focus position of the lens unit 110.

Figure 17:
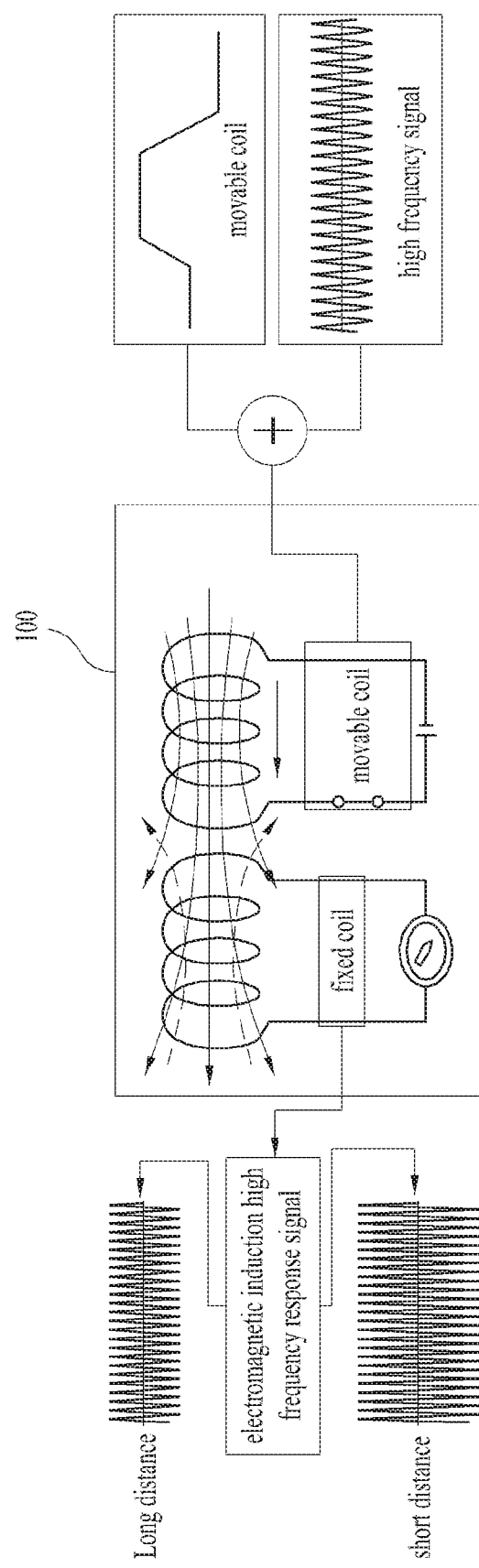
FIG. 17 is a diagram for explaining electromagnetic induction between a fixed coil of a sensing unit and a movable coil of a lens unit.

FIG. 17 is a diagram for explaining electromagnetic induction between a fixed coil of a sensing unit and a movable coil of a lens unit.

As shown in FIG. 17, a camera module of the present invention can include a fixed coil of the sensing unit and a movable coil of the lens unit. A current or voltage can be induced to the fixed coil of the sensing unit from the movable coil of the lens unit by electromagnetic induction. In this case, the induced current or voltage value may vary depending on a distance between the movable coil of the lens unit and the fixed coil of the sensing unit. In particular, the current or voltage induced to the fixed coil of the sensing unit varies according to a vertical distance between the movable coil of the lens unit and the fixed coil of the sensing unit. It may be able to predict a moving position of the lens unit using a displacement value.

A drive signal carrying a high frequency signal on a low frequency signal is applied to the movable coil of the lens unit and the drive signal can be transmitted to the fixed coil of the sensing unit. In particular, the drive signal, which is applied to the movable coil of the lens unit, may correspond to a signal carrying a random high frequency signal on a drive signal of a low frequency. Hence, the fixed coil receives a frequency signal for the current or voltage induced from the movable coil by the electromagnetic induction. The received frequency signal may correspond to a signal carrying a high frequency signal on a low frequency signal. In this case, an electromagnetic induction high frequency response signal received by the fixed coil becomes weaker as a distance between the fixed coil and the movable coil is getting longer. The electromagnetic induction high frequency response signal becomes stronger as the distance between the fixed coil and the movable coil is getting shorter.

Since the electromagnetic induction high frequency response signal received by the fixed coil varies depending on the distance between the fixed coil and the movable coil, if the detecting unit detects a displacement value of the current or voltage received by the fixed coil, the controller can predict a moving position value of the lens unit using the displacement value.

The controller finds out an optimized auto focus position value using the predicted position value of the lens unit and may be able to control movement of the lens unit to make an actual position value of the lens unit move to the optimized auto focus position value.

Meanwhile, when a drive signal is applied to the movable coil of the lens unit, the controller can synthesize the drive signal corresponding to a low frequency signal with a random high frequency signal. In this case, the drive signal corresponding to the low frequency signal may include a signal component for moving the lens unit. The high frequency signal synthesized in the drive signal may be a signal component for sensing a moving position of the lens unit and include a frequency signal higher than the drive signal. For instance, the high frequency signal synthesized in the drive signal may correspond to a signal of 100 kHz~5 MHz, by which the present invention may be non-limited.

And, the controller detects a high frequency signal from a signal received by the fixed coil of the sensing unit via the detecting unit and may be able to calculate a focus position value of the lens unit based on the detected high frequency signal via the calculating unit.

The reason why the drive signal is applied to the movable coil is to easily detect a displacement value of current or voltage by making a frequency signal for the current or voltage induced to the fixed coil to be increased by the electromagnetic induction.

Figure 18:
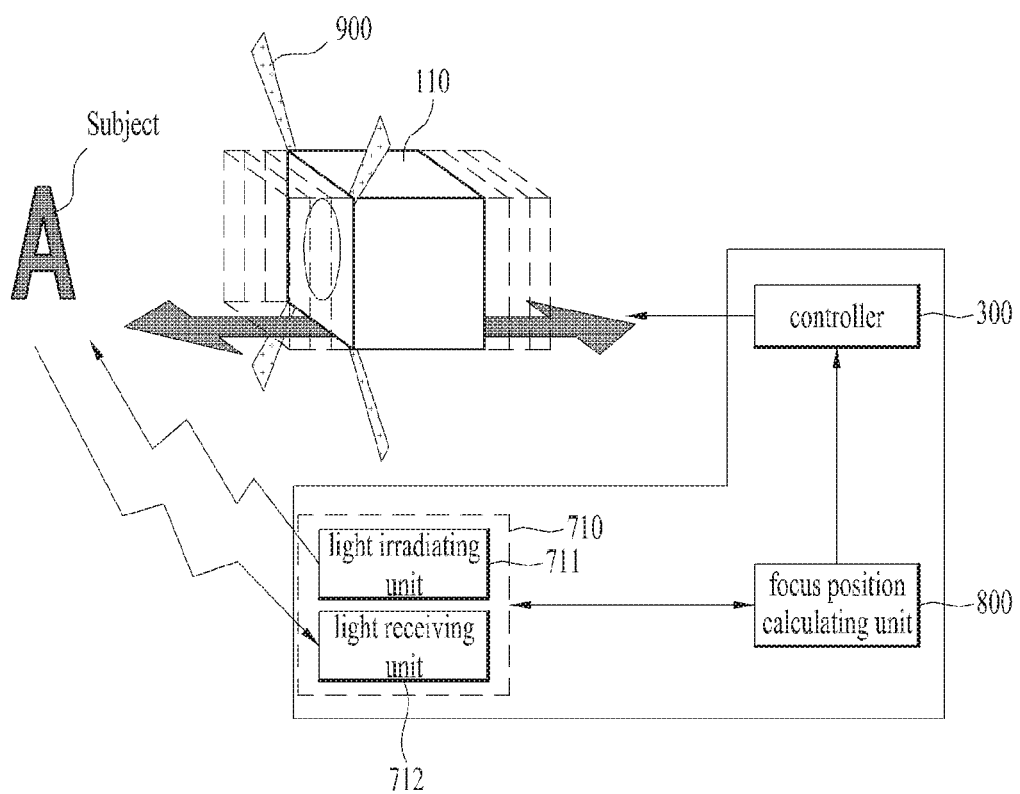
FIGS. 18 and 19 are block diagrams for a camera module according to a further different embodiment of the present invention.

FIG. 18 is a block diagram for a camera module according to a further different embodiment of the present invention.

As shown in FIG. 18, a camera module of the present invention includes a sensing unit for sensing a movement of a lens unit 110. In this case, the camera module may use a laser focus scheme that calculates a focus position using a distance from a subject.

The camera module using the laser focus scheme can include a distance sensor 710, a focus position calculating unit 800, and a controller 300. In this case, the distance sensor 710 senses a distance from a subject to be captured.

For example, the distance sensor 710 can include a light irradiating unit 711 configured to irradiate light to a subject and a light receiving unit 712 configured to receive the light reflected from the subject. The light irradiating unit 711 may correspond to at least one laser diode or vertical cavity surface emitting laser (VCSEL). In some cases, the light irradiating unit 711 may correspond to an infrared light source.

The focus position calculating unit 800 can calculate a focus position value based on the distance from the subject sensed by the distance sensor 710. In this case, if the distance sensor 710 senses the distance from the subject, the focus position calculating unit 800 can calculate a focus position value according to a distance with reference to a data table stored in a memory in advance.

If an initial operation command for focus compensation is received, the controller 300 calculates a compensation value due to a signal distortion. If a focus operation command is received, the controller controls the focus position calculating unit 800 to calculate a focus position value, moves the lens unit 110 to a focus position based on the calculated compensation value and the focus position value, and can compensate for the focus position of the lens unit 110.

Figure 19:
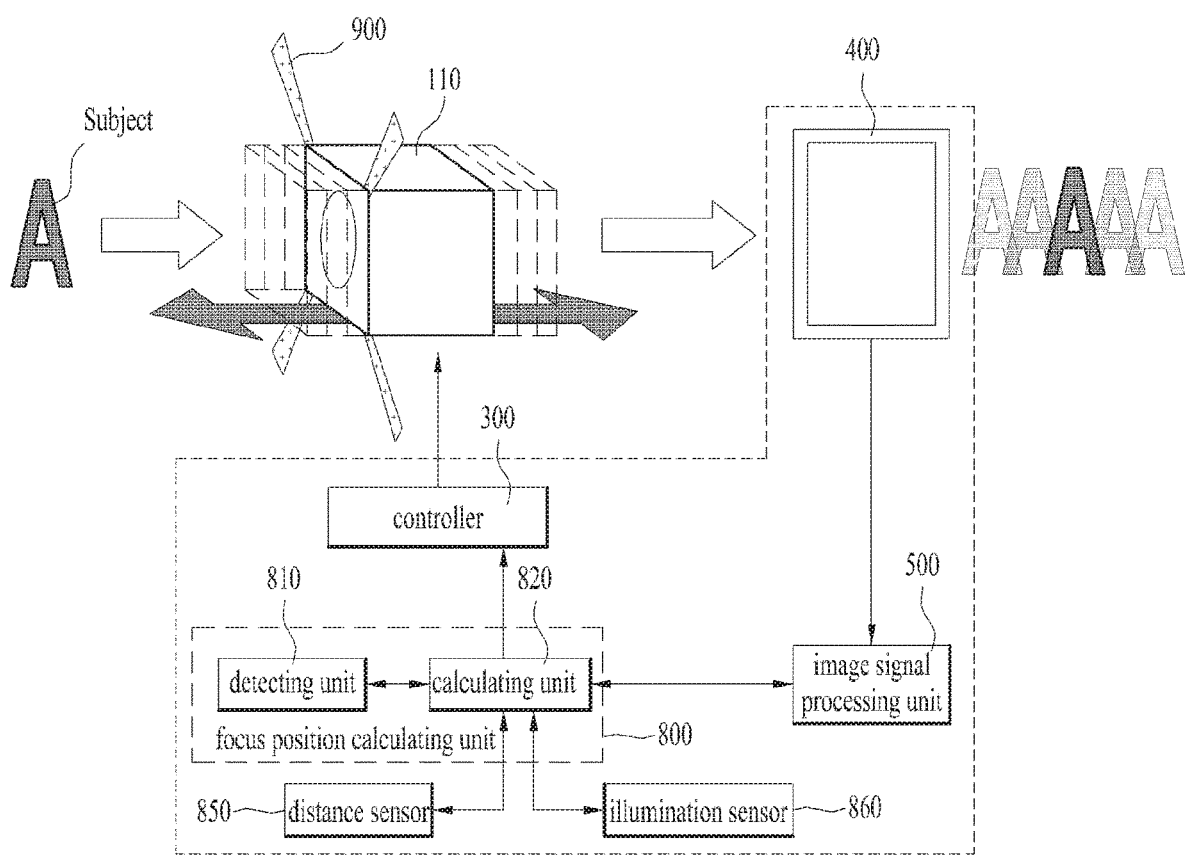

FIG. 19 is a block diagram for a camera module according to a further different embodiment of the present invention.

As shown in FIG. 19, a camera module of the present invention includes a sensing unit for sensing a movement of a lens unit 110. In this case, the camera module may use a hybrid focus scheme for calculating a focus position using one of a contrast focus scheme for calculating a focus position using image contrast of a subject according to external brightness and a laser focus scheme for calculating a focus position using a distance from the subject. In particular, according to the present invention, in order to optimize performance of the camera module, an image is captured using the contrast focus scheme in environment in which external brightness is bright and an image is captured using the laser focus scheme in environment in which external brightness is dark.

The camera module of the hybrid focus scheme can include an image sensor 400, an image signal processing unit 500, a focus position calculating unit 800, a controller 300, a distance sensor 850, and an illumination sensor 860. In this case, the image sensor 400 senses an image of a subject incident via the lens unit 110 which moves in a manner of being connected with a spring. The image signal processing unit 500 processes an image signal sensed by the image sensor 400. The distance sensor 850 can sense a distance from a subject to be captured.

The focus position calculating unit 800 can calculate a focus position value based on the image signal processed by the image signal processing unit 500 and a displacement value of a current or voltage received from the sensing unit.

In this case, the focus position calculating unit 800 can include a detecting unit 810 and a calculating unit 820.

The detecting unit 810 of the focus position calculating unit 800 detects a displacement value of a current or voltage received from a fixed coil of the sensing unit.

And, if the auto focus scheme of the present invention is configured by the contrast focus scheme for calculating a focus position using image contrast of a subject, the calculating unit 820 of the focus position calculating unit 800 can calculate a focus position value of the lens unit 110 based on the image signal processed by the image signal processing unit 500 and the displacement value of the current or voltage detected by the detecting unit 810. In this case, the calculating unit 820 compares contrasts of signal-processed images with each other, extracts an image of highest contrast, and determines a position of the lens unit 110 at which the extracted image is captured as an optimized focus position.

If the auto focus scheme of the present invention is configured by the laser focus scheme for calculating a focus position using a distance from a subject, the calculating unit 820 of the focus position calculating unit 800 can calculate a focus position value based on a distance from a subject sensed by the distance sensor 850. In this case, if the distance sensor 850 senses the distance from the subject, the calculating unit 820 can calculate a focus position value according to a distance with reference to a data table stored in a memory in advance.

If an initial operation command for focus compensation is received, the controller 300 calculates a compensation value due to a signal distortion. If a focus operation command is received, the controller controls the focus position calculating unit 800 to calculate a focus position value, moves the lens unit 110 to a focus position based on the calculated compensation value and the focus position value, and can compensate for the focus position of the lens unit 110.

Meanwhile, the illumination sensor 860 can sense external brightness.

If external brightness sensed by the illumination sensor 860 is equal to or greater than a reference value, the focus position calculating unit 800 can calculate a focus position value based on the image signal processed by the image signal processing unit 500 and the displacement value of the current or voltage received from the sensing unit.

If the external brightness sensed by the illumination sensor 860 is less than a reference value, the focus position calculating unit 800 can calculate a focus position value based on a distance from a subject sensed by the distance sensor 850. For example, the reference value for the external brightness may correspond to about 100 lux, by which the present invention may be non-limited.

If the external brightness sensed by the illumination sensor 860 is less than the reference value, the controller 300 may provide a display screen with a notification message notifying that a focusing scheme is switching to a laser focusing scheme for calculating a focus position using a distance from a subject from a contrast focusing scheme for calculating a focus position using image contrast of the subject. In this case, the reason why the notification message is provided is to make a user recognize a focus type of a currently captured image and compare image quality of images captured by various focus types via the notification message, and provide the user with user convenience capable of capturing an image using a focus scheme preferred by the user.

As a different example, if reference value configuration request signal for external brightness is received, the controller 300 can provide a reference value configuration window to a display screen. If a reference value configuration completion signal for the external brightness is received via the reference value configuration window, the controller 300 can change a reference value for the external brightness according to a configuration completed configuration value. In this case, the reason why the reference value configuration window is provided is to provide a user with user convenience to enable the user to directly configure the timing at which the contrast focus scheme is switched to the laser focus scheme.

As a further different example, if an auto focus configuration request signal is received, the controller 300 provides an auto focus configuration window to the display screen. If an auto focus configuration completion signal is received via the auto focus configuration window, the controller 300 can calculate a focus position value according to a configuration completed auto focus scheme. In this case, the auto focus configuration window can include a contrast focus item for calculating a focus position using image contrast of a subject, a laser focus item for calculating a focus position using a distance from the subject, and a hybrid focus item for calculating a focus position using one of a contrast focus scheme for calculating a focus position using image contrast of a subject and a laser focus scheme for calculating a focus position using a distance from the subject.

In particular, the auto focus scheme of the present invention may correspond to the hybrid focus scheme for calculating a focus position using one of the contrast focus scheme for calculating a focus position using image contrast of a subject according to external brightness and the laser focus scheme for calculating a focus position using a distance from the subject. In particular, according to the present invention, in order to optimize performance of the camera module, an image is captured using the contrast focus scheme in environment in which external brightness is bright and an image is captured using the laser focus scheme in environment in which external brightness is dark.

Figure 20:
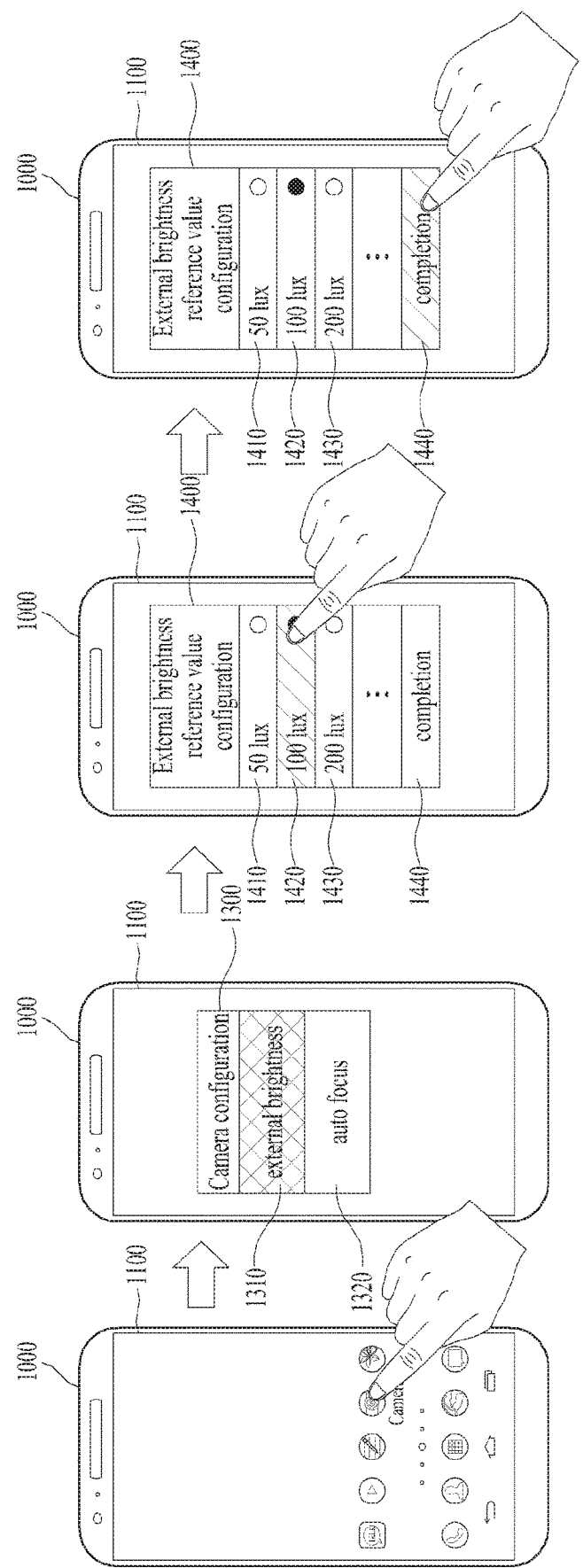
FIG. 20 is a diagram for explaining a method of configuring a reference value for external brightness.

FIG. 20 is a diagram for explaining a method of configuring a reference value for external brightness.

As shown in FIG. 20, if a user selects a camera configuration icon 1200 provided on a display screen 1100 of a mobile terminal 100, a controller of a camera module can provide a camera configuration window 1300 on the display screen 1100. In this case, the camera configuration window 1300 can include an external brightness configuration item 1310 and an auto focus configuration item 1320.

Subsequently, if the user selects the external brightness configuration item 1310, the controller of the camera module can provide a reference value configuration window 1400 for external brightness on the display screen 1100. In this case, the reference value configuration window 1400 for external brightness can include external brightness number items such as 50 lux item 1410, 100 lux item 1420, 200 lux item 1430, etc. and a selection completion item 1440.

Subsequently, if the user selects the selection completion item 1440 after the 100 lux item 1420 is selected, the controller of the camera module may change the reference value for the external brightness according to the configuration completed configuration value.

In particular, according to the present invention, if the reference value configuration request signal for external brightness is received, the reference value configuration window 1400 can be provided on the display screen 1100.

According to the present invention, if a reference value configuration completion signal for external brightness is received via the reference value configuration window 1400, the reference value for the external brightness can be changed according to the configuration completed configuration value. In this case, the reason why the reference value configuration window is provided is to provide user convenience to a user to enable the user to directly configure the timing at which the contrast focus scheme is switched to the laser focus scheme.

Figure 21:
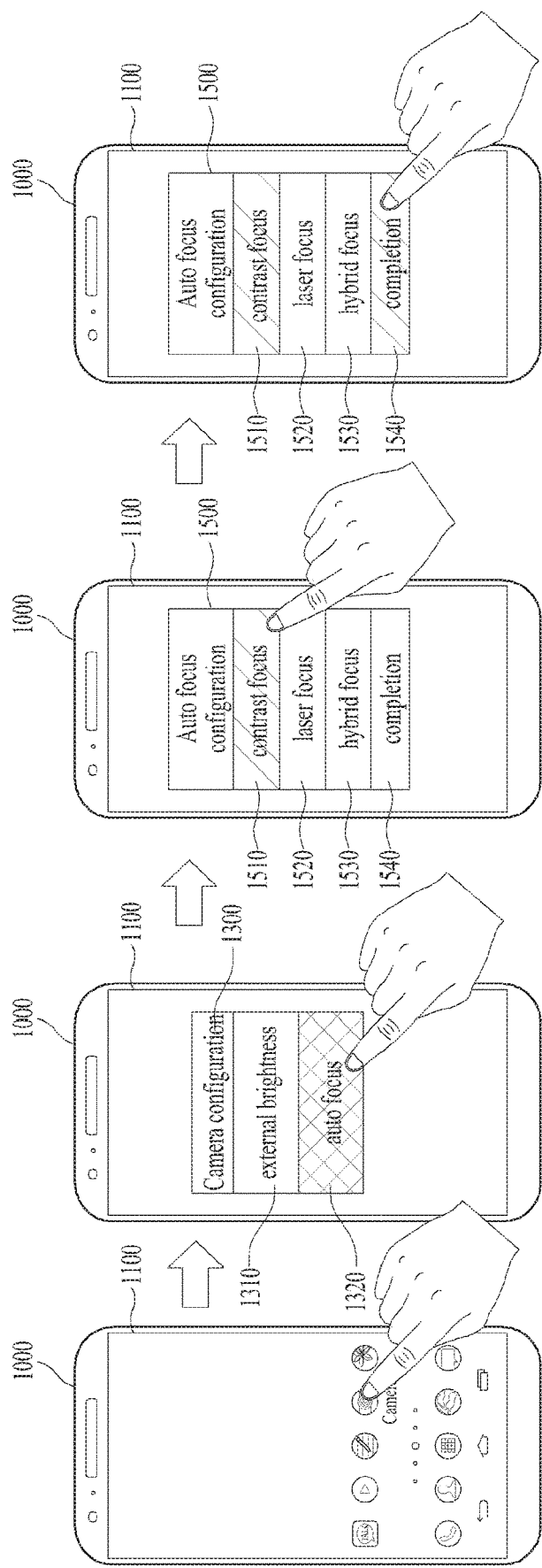
FIG. 21 is a diagram for explaining a method of configuring an auto focus.

FIG. 21 is a diagram for explaining a method of configuring an auto focus.

As shown in FIG. 21, if a user selects a camera configuration icon 1200 provided on a display screen 1100 of a mobile terminal 100, a controller of a camera module can provide a camera configuration window 1300 on the display screen 1100. In this case, the camera configuration window 1300 can include an external brightness configuration item 1310 and an auto focus configuration item 1320.

Subsequently, if the user selects the auto focus configuration items 1320, the controller of the camera module can provide an auto focus configuration window 1500 on the display screen 1100. In this case, the auto focus configuration window 1500 can include a contrast focus item 1510, a laser focus item 1520, and a hybrid focus item 1530. In addition, the auto focus configuration window 1500 can further include a selection completion item 1540.

The contrast focus item 1510 corresponds to a focus scheme for calculating a focus position using image contrast of a subject, the laser focus item 1520 corresponds to a focus scheme for calculating a focus position using a distance from the subject. And, the hybrid focus item 1530 corresponds to a focus scheme for calculating a focus position using one of the contrast focus scheme for calculating a focus position using image contrast of a subject and the laser focus scheme for calculating a focus position using a distance from the subject.

Subsequently, if the user selects the selection completion item 1540 after the contrast focus item 1510 is selected, the controller of the camera module can calculate a focus position value using the configured contrast focus scheme.

In particular, according to the present invention, if an auto focus configuration request signal is received, an auto focus configuration window is provided on the display screen. If an auto focus configuration completion signal is received via the auto focus configuration window, it may be able to calculate a focus position value according to a configured auto focus scheme.

Figure 22:
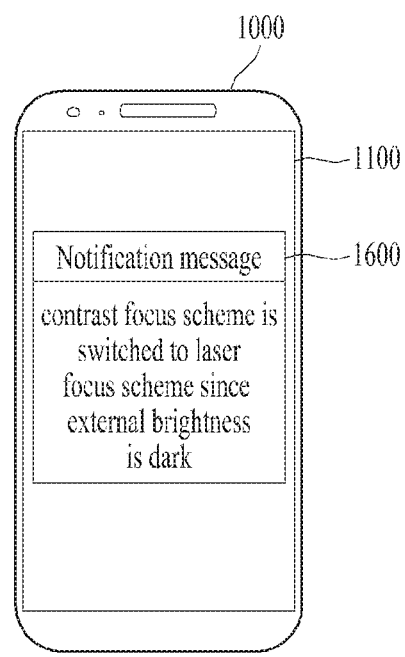
FIG. 22 is a diagram for a switch notification message of an auto focus scheme.

FIG. 22 is a diagram for a switch notification message of an auto focus scheme.

As shown in FIG. 22, if external brightness sensed by an illumination sensor is equal to or greater than a reference value, a focus position calculating unit of a camera module can calculate a focus position value based on an image signal processed by an image signal processing unit and a displacement value of a current or voltage received from a fixed coil.

Subsequently, if the external brightness sensed by the illumination sensor is less than the reference value, the focus position calculating unit can calculate a focus position value based on a distance from a subject sensed by a distance sensor.

And, if the external brightness sensed by the illumination sensor is less than the reference value, the controller can provide a display screen 1100 of a mobile terminal 1000 with a notification message 1600 notifying that the contrast focus scheme for calculating a focus position using image contrast of a subject is switched to the laser focus scheme for calculating a focus position using a distance from the subject. In this case, the reason why the notification message is provided is to make a user recognize a focus type of a currently captured image and compare image quality of images captured by various focus types via the notification message, and provide the user with user convenience capable of capturing an image using a focus scheme preferred by the user.

Figure 23:
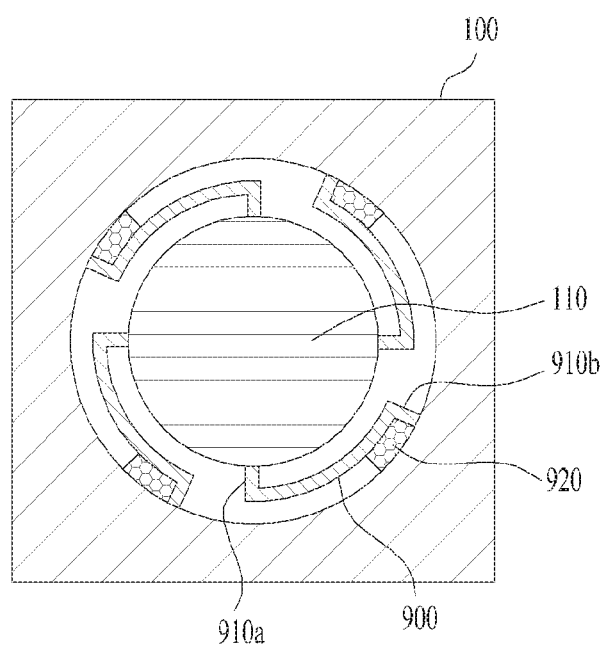
FIG. 23 is a floor plan of a spring connected with a lens unit.

FIG. 23 is a layout of a spring connected with a lens unit.

As shown in FIG. 23, a spring 900 is connected between a fixed unit and a lens unit 100 of a camera unit 100 to provide an elastic force according to the movement of the lens unit 100. In this case, the spring 900 may include a first connecting part 910a connected to the lens unit 110 and a second connecting part 910b connected to the fixed unit of the camera unit 100.

In general, since the spring 900 has the natural frequency, after the lens unit 110 has moved, it may cause a time loss for the lens unit 110 to wait for a prescribed time due to the natural frequency of the spring until being stabilized. Hence, by disposing a damper 920 between the spring 900 and the fixed unit, it is able to suppress the natural oscillation of the spring. In particular, a position of the damper 920 can be disposed in any region between the spring 900 and the fixed unit. For instance, the damper 920 may be disposed adjacent to the second connecting part 910b connecting the spring 900 and the fixed unit.

Hence, by providing the damper between the spring 900 and the fixed unit of the camera unit 100, the natural oscillation of the spring 900 can be suppressed. By reducing hysteresis properties, error of auto focus can be prevented and auto focus time can be reduced.

Figure 24:
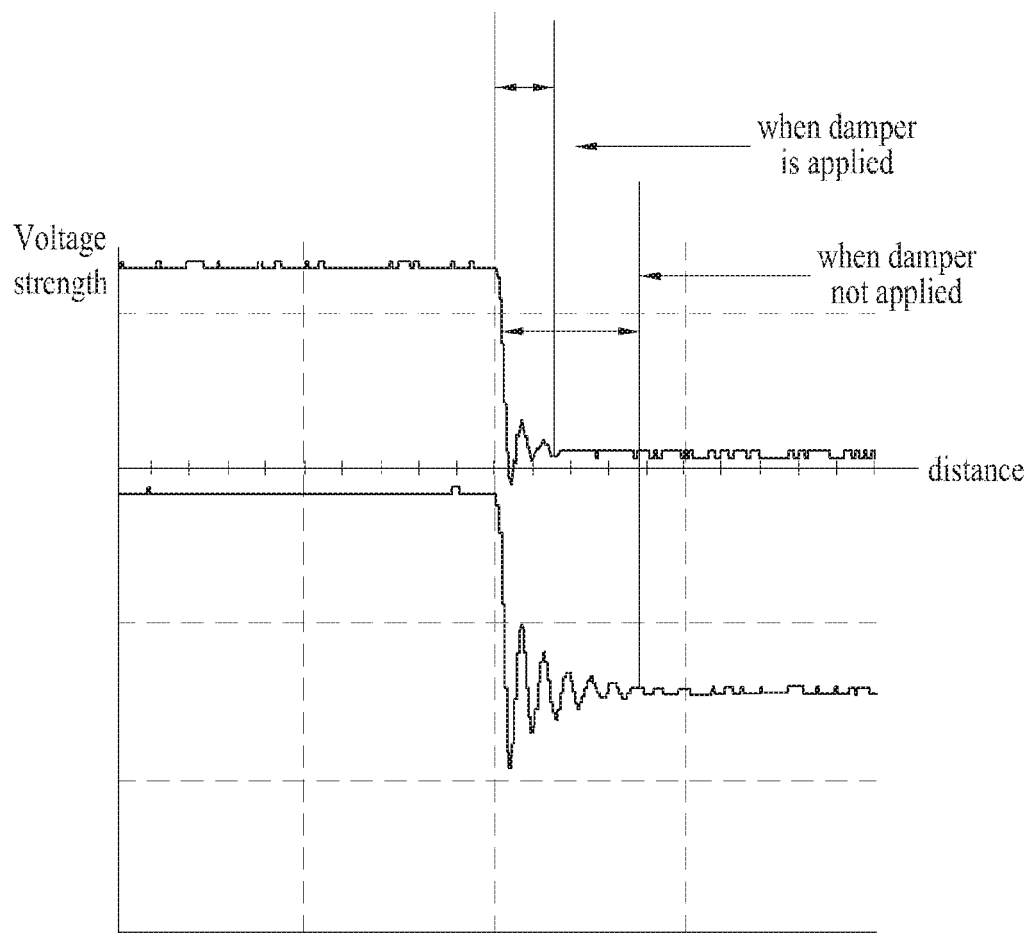
FIG. 24 is a graph illustrating natural oscillation frequency characteristics before and after applying a damper of a spring

FIG. 24 is a graph of natural oscillation frequency characteristics before and after applying a damper to a wiring.

Referring to FIG. 24, if a damper is not applied to a spring, after a lens unit has moved, it takes a long time until the lens unit is stabilized. Hence, an unnecessary time loss may be generated.

Yet, if a damper is applied to a wiring, after the lens unit has moved, the lens unit is stabilized in a very short time. Hence, it is able to remove the unnecessary time loss to wait for the stabilization of the lens unit.

Therefore, by applying the damper to the spring, the present invention suppresses the natural oscillation of the spring. By reducing hysteresis properties, the present invention prevents error of auto focus and reduces auto focus time.

FIGS. 25 to 29 are flowcharts for explaining a method of controlling an auto focus in a camera module according to the present invention.

Figure 25:
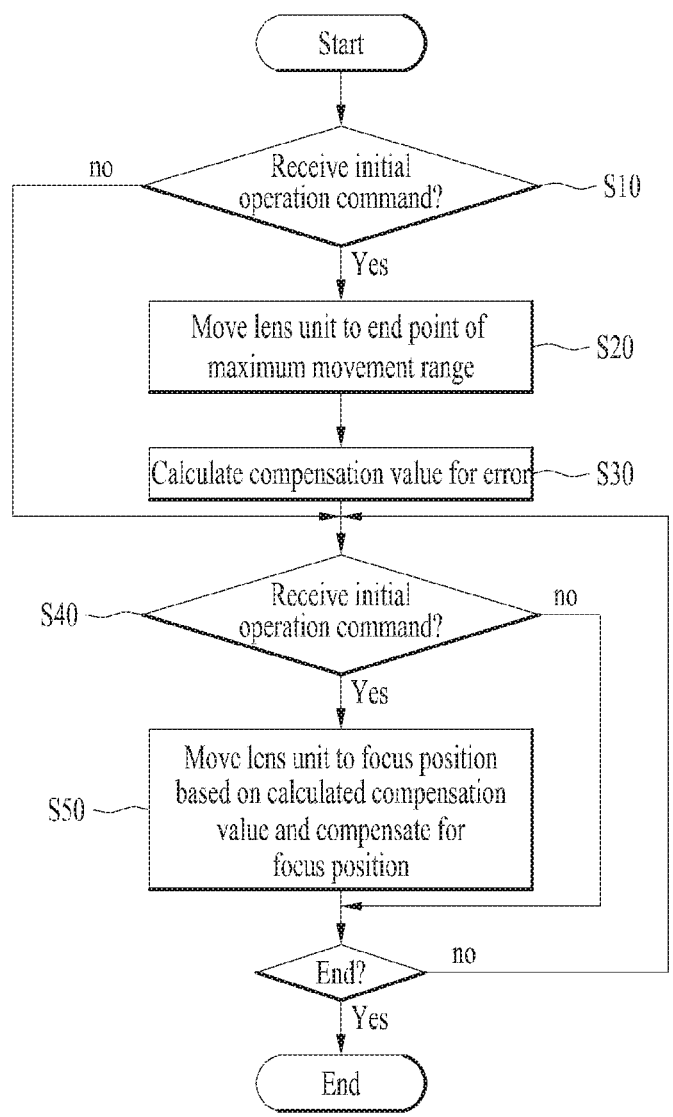
FIGS. 25 to 29 are flowcharts for explaining a method of controlling an auto focus in a camera module according to the present invention.

As shown in FIG. 25, the controller checks whether or not an initial operation command is received [S10].

In this case, the initial operation command can be received when power of a device including a camera module is turned on.

In some cases, the initial operation command can also be received when a camera app for operating the camera module is executed.

As a different case, the initial operation command can also be received when the camera module is operated and a user input for requesting focus compensation is received.

As a further different case, the initial operation command can also be received when a lens unit deviates from a focus movement range.

As a further different case, the initial operation command can also be received when a metal object is installed in the vicinity of the lens unit.

As a further different case, the initial operation command can also be received when a metal object installed in the vicinity of the lens unit is removed.

Subsequently, as shown in FIG. 25, if the initial operation command is received, the controller can move the lens unit to an end point of a maximum movement range [S20].

Figure 26:
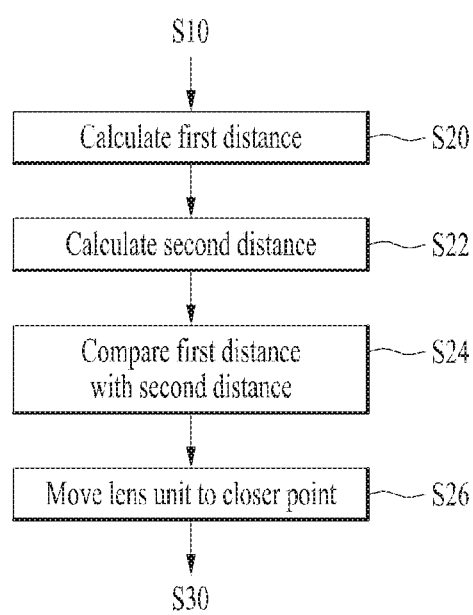

In this case, when the lens unit is moved to the end point of the maximum movement range, as shown in FIG. 26, if the initial operation command is received, the controller can calculate a fist distance between a current position point of the lens unit and a first end point of the maximum movement range [S21]. And, the controller can calculate a second distance between the current position point of the lens unit and a second end point of the maximum movement range [S22]. Subsequently, the controller can compare the first distance and the second distance with each other [S24]. Subsequently, the controller can move the lens unit to an end point closer to the lens unit among the first and the second end points of the maximum movement range [S26].

As shown in FIG. 25, when the lens unit is positioned at the end point of the maximum movement range, the controller can calculate a compensation value for an error by comparing a sensing signal sensed by a sensing unit with a predetermined reference signal [S30].

Figure 27:
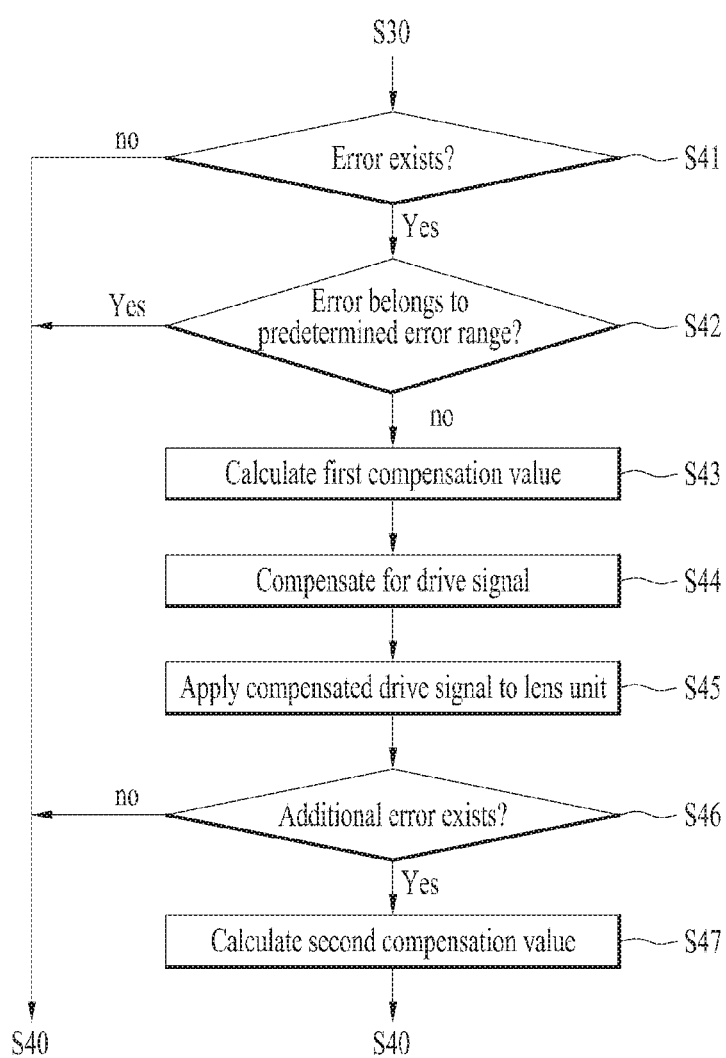

In this case, when the compensation value for the error is calculated, as shown in FIG. 27, the controller can check whether or not there is an error by comparing a sensing signal sensed by a sensing unit with a predetermined reference signal [S41]. If an error is checked, the controller can check whether or not the error belongs to a predetermined error range [S42]. Subsequently, if the error does not belong to the predetermined error range, the controller calculates and stores a first compensation value for the error [S43]. Subsequently, the controller can compensate for a drive signal applied to the lens unit based on the calculated first compensation value [S44]. Subsequently, the controller can apply the compensated drive signal to the lens unit [S45]. Subsequently, the controller compares the sensing signal sensed by the sensing unit with the predetermined reference signal to check whether or not there is an additional error [S46]. Subsequently, if an additional error is checked, the controller can calculate and store a second compensation value for the additional error [S47].

When the sensing signal sensed by the sensing unit is compared with the predetermined reference signal to check whether or not there is an error [S41], if no error is checked, the controller may not calculate a compensation value for an error. In this case, the reason why the compensation value for the error is not calculated is to quickly perform an auto focus operation.

When the sensing signal sensed by the sensing unit is compared with the predetermined reference signal to check whether or not there is an error [S42], if an error belongs to a predetermined error range, the controller may not calculate a compensation value for the error. In this case, the reason why the first compensation value for the error is not calculated is to quickly perform an auto focus operation.

When the sensing signal sensed by the sensing unit is compared with the predetermined reference signal to check whether or not there is an additional error [S46], if no additional error is checked, the controller may not calculate a second compensation value for the additional error. In this case, the reason why the second compensation value for the error is not calculated is to quickly perform an auto focus operation.

Figure 28:
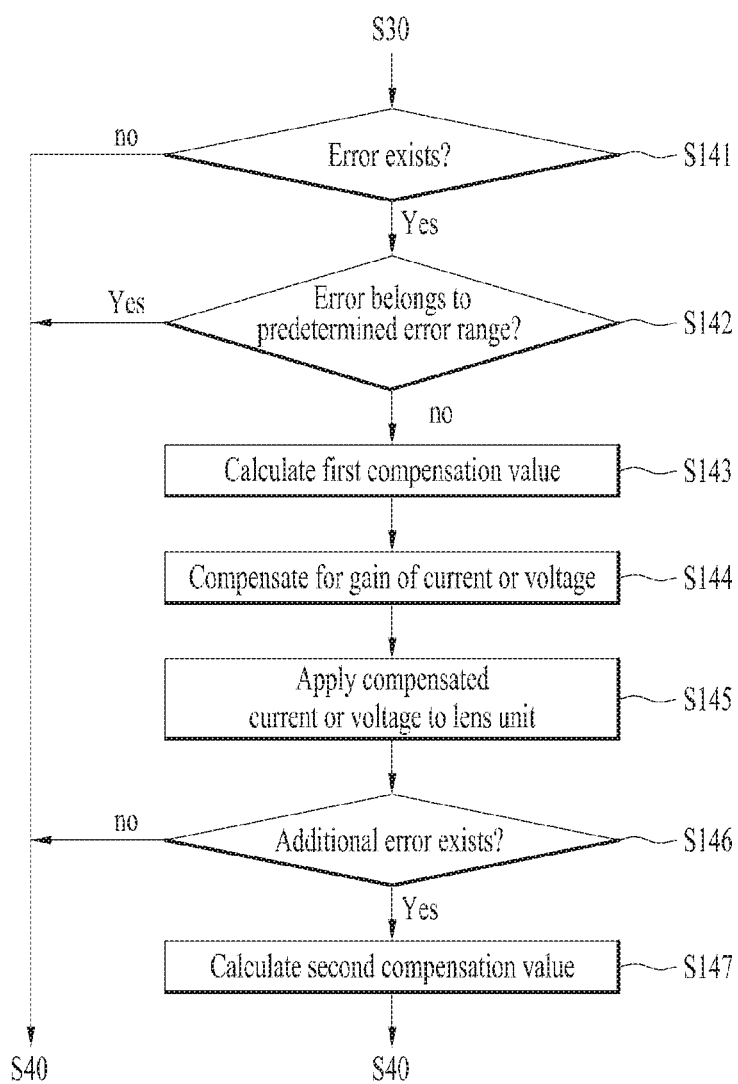

As a different case, when a compensation value for an error is calculated, as shown in FIG. 28, the controller compares the sensing signal sensed by the sensing unit with the predetermined reference signal to check whether or not there is an error [S141]. Subsequently, if an error does not belong to a predetermined error range, the controller can calculate and store a first compensation value for the error [S143]. Subsequently, the controller can compensate for a gain of a current or voltage applied to the lens unit based on the calculated first compensation value [S144]. Subsequently, the controller can apply the gain-compensated current or voltage to the lens unit [S145]. Subsequently, the controller compares the sensing signal sensed by the sensing unit with the predetermined reference signal to check whether or not there is an additional error [S146]. Subsequently, if the additional error is checked, the controller can calculate and store a second compensation value for the additional error [S147].

When the sensing signal sensed by the sensing unit is compared with the predetermined reference signal to check whether or not there is an error [S141], if no error is checked, the controller may not calculate a compensation value for an error. In this case, the reason why the compensation value for the error is not calculated is to quickly perform an auto focus operation.

When the controller checks whether or not an error belongs to a predetermined error range [S142], if the error belongs to the predetermined error range, the controller may not calculate a compensation value for the error. In this case, the reason why the first compensation value for the error is not calculated is to quickly perform an auto focus operation.

When the sensing signal sensed by the sensing unit is compared with the predetermined reference signal to check whether or not there is an additional error [S146], if no additional error is checked, the controller may not calculate a second compensation value for the additional error. In this case, the reason why the second compensation value for the error is not calculated is to quickly perform an auto focus operation.

Subsequently, as shown in FIG. 25, the controller can check whether or not a focus operation command is received [S40].

If the focus operation command is received, the controller moves the lens unit to a focus position based on a calculated compensation value and may be able to compensate for the focus positon of the lens unit [S50].

Figure 29:
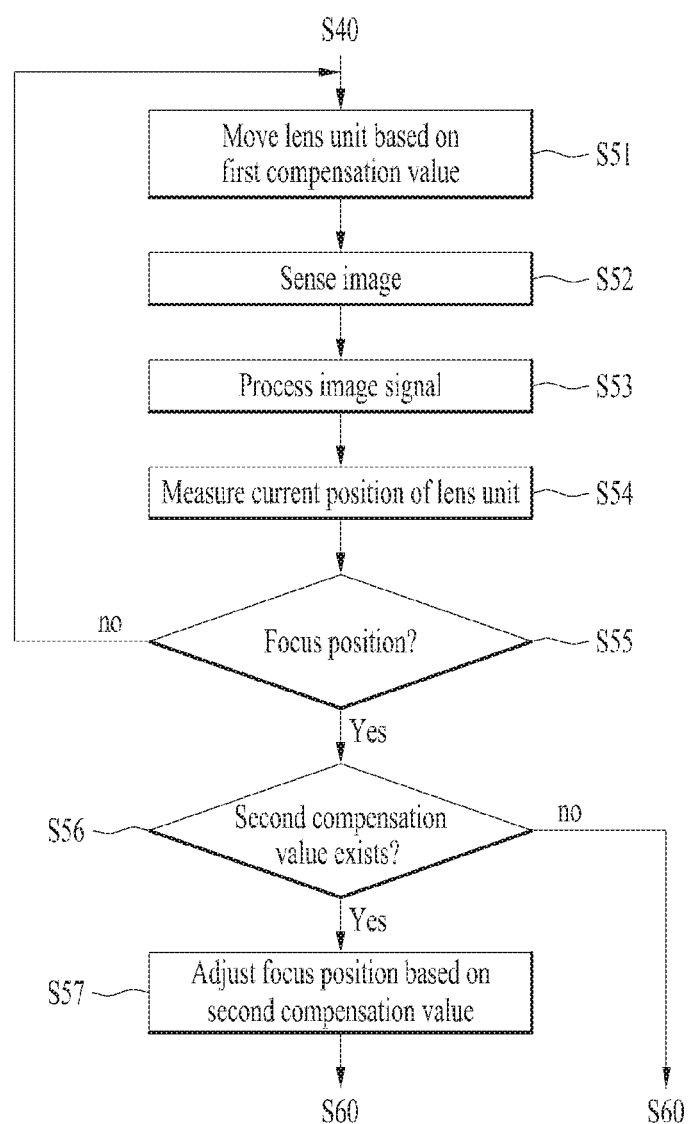

In this case, when the focus position of the lens unit is compensated, as shown in FIG. 29, if the focus operation command is received, the controller can move the lens unit based on the first compensation value among the calculated compensation values [S51]. Subsequently, the controller can sense an image incident via a lens of the lens unit according to the movement of the lens unit [S52]. Subsequently, the controller processes a sensed image signal [S53] and may be able to measure a current position of the moved lens unit [S54]. The control unit can check whether or not the measured current position of the lens unit corresponds to a focus position [S55]. Subsequently, if the current position of the lens unit corresponds to the focus position, the controller can check whether or not there is a second compensation value among calculated compensation values [S56]. Subsequently, if there is the second compensation value, the controller can compensate for the focus position of the lens unit based on the second compensation value [S57].

For example, the first compensation value may correspond to a compensation value for compensating for a drive signal applied to the lens unit or a compensation value for compensating for a gain of a current or voltage applied to the lens unit. And, the second compensation value may correspond to a compensation value for compensating for a sensing signal sensed by the sensing unit.

According to the present invention, it is able to compensate for a focus position due to distortion by calculating a compensation value in a manner of comparing a signal sensed by a sensing unit with a predetermined reference signal when a lens unit is positioned at an end point of a maximum moving range.

According to the present invention, it is able to prevent an error operation of auto focus due to an external metal object, thereby enhancing picture quality.

According to the present invention, when a lens unit is moved to an end point of a maximum moving range, it is able to promptly calculate a compensation value by moving the lens unit to an end point closest from a current position of the lens unit.

According to the present invention, when a compensation value for an error is calculated, it is able to find out an accurate auto focus position by calculating at least one of a first compensation value for compensating for a drive signal applied to a lens unit and a second compensation value for compensating for a signal sensed by a sensing unit.

According to the present invention, when a compensation value for an error is calculated, it is able to find out an accurate auto focus position by calculating at least one of a first compensation value for compensating for a gain for a current or voltage applied to a lens unit and a second compensation value for compensating for a signal sensed by a sensing unit.

According to the present invention, when an error belongs to a predetermined error range, it is able to promptly compensate for a focus position due to distortion by not calculating a first compensation value for the error.

According to the present invention, if there is no additional error, it is able to promptly compensate a focus position due to distortion by not calculating a second compensation value for the additional error.

According to the present invention, it is able to perform auto focus using at least one selected from the group consisting of a contrast focus scheme, a laser focus scheme, and a hybrid focus scheme according to a user request or external brightness, thereby increasing user convenience.

According to the present invention, it is able to prevent an error of auto focus and reduce auto focus time by reducing natural oscillation of a spring in a manner of deploying a damper between the spring and a fixed unit.

MODE FOR INVENTION

The camera module according to the present invention and the auto focus method of the camera module may be non-limited by the configurations and methods described in the foregoing embodiments. All or a part of the embodiments can be configured in a manner of being selectively combined to achieve various modifications from the embodiments.

While the present invention has been described and illustrated herein with reference to the preferred embodiments thereof, it will be apparent to those skilled in the art that various modifications and variations can be made therein without departing from the spirit and scope of the invention. Thus, it is intended that the present invention covers the modifications and variations of this invention that come within the scope of the appended claims and their equivalents.

INDUSTRIAL APPLICABILITY

The present invention relates to a camera module including a voice coil motor actuator and an auto focus method therefor. Hence, the present invention is industrially usable.

What is claimed is:

1. A camera module performing auto focus by moving a lens unit, the camera module comprising:
    a sensing unit configured to sense a movement of the lens unit;
    a sensor configured to sense whether a metal object is installed in vicinity of the camera module; and
    a controller configured to:
        control the movement of the lens unit based on at least a sensing signal sensed by the sensing unit,
        move the lens unit to an end point of a maximum movement range in response to sensing, by the sensor, that the metal object is installed in the vicinity of the camera module,
        compare the sensing signal sensed by the sensing unit with a predetermined reference signal to calculate a compensation value for an error in response to the moved lens unit positioned at the end point of the maximum movement range, and
        move the lens unit to a focus position and compensate for the focus position of the lens unit based on the calculated compensation value in response to receiving a focus operation command.

2. The camera module of claim 1, wherein the sensing unit includes a coil sensor configured to sense a current or voltage varying according to a distance from the lens unit.

3. The camera module of claim 1, wherein the sensing unit is deployed in a manner of being apart from one side of the lens unit as much as a prescribed space and is positioned on a moving direction of the lens unit.

4. The camera module of claim 1, wherein the maximum movement range corresponds to a moving distance between a first end point to which the lens unit is able to maximally move forward and a second end point to which the lens unit is able to maximally move backward.

5. The camera module of claim 4, wherein the controller is configured to move the lens unit to the end point of the maximum movement range by:
    calculating a first distance between a current position point of the lens unit and a first end point of the maximum movement range,
    calculating a second distance between the current position point of the lens unit and a second end point of the maximum movement range, and
    moving the lens unit to an end point closer to the lens unit among the first and second end points of the maximum movement range by comparing the first distance and the second distance with each other.

6. The camera module of claim 1, wherein the controller is configured to calculate the compensation value for the error by calculating at least one of a first compensation value for compensating for a drive signal applied to the lens unit and a second compensation value for compensating for the sensing signal sensed by the sensing unit.

7. The camera module of claim 6, wherein the controller is configured to calculate the first compensation value by:
    comparing the sensing signal sensed by the sensing unit with the predetermined reference signal to check whether or not there is an error, and
    when the error is checked, calculating the first compensation value for the error and storing the calculated first compensation value.

8. The camera module of claim 7, wherein the first compensation value for the error is calculated only the checked error does not belong to a predetermined error range.

9. The camera module of claim 6, wherein the controller is configured to calculate the second compensation value by:
  compensating for the drive signal applied to the lens unit based on the calculated first compensation value,
  applying the compensated drive signal to the lens unit,
  checking whether or not there is an additional error by comparing the sensing signal sensed by the sensing unit with the predetermined reference signal,
  when the additional error is checked, calculating the second compensation value for the additional error, and
  storing the calculated second compensation value.

10. The camera module of claim 6, wherein the controller is configured to compensate for the focus position of the lens unit by:
  moving the lens unit to a focus position by compensating for the drive signal applied to the lens unit based on the calculated first compensation value, and
  compensating for the focus position of the lens unit based on the calculated second compensation value.

11. A method for autofocusing in a camera module, the method comprising:
  sensing a movement of a lens unit via a sensing unit;
  controlling the movement of the lens unit based on at least a sensing signal sensed by the sensing unit;
  moving the lens unit to an end point of a maximum movement range in response to sensing, by a sensor, that a metal object is installed in vicinity of the camera module;
  comparing the sensing signal sensed by the sensing unit with a predetermined reference signal to calculate a compensation value for an error in response to the moved lens unit positioned at the end point of the maximum movement range; and
  moving the lens unit to a focus position based on the calculated compensation value and compensating for the focus position of the lens unit in response to receiving a focus operation command.

12. The method of claim 11, wherein the sensing unit includes a coil sensor configured to sense a current or voltage varying according to a distance from the lens unit.

13. The method of claim 11, wherein the sensing unit is deployed in a manner of being apart from one side of the lens unit as much as a prescribed space and is positioned on a moving direction of the lens unit.

14. The method of claim 11, wherein the maximum movement range corresponds to a moving distance between a first end point to which the lens unit is able to maximally move forward and a second end point to which the lens unit is able to maximally move backward.

15. The method of claim 14, wherein moving the lens unit to the end point of the maximum movement range further comprises:
  calculating a first distance between a current position point of the lens unit and a first end point of the maximum movement range,
  calculating a second distance between the current position point of the lens unit and a second end point of the maximum movement range, and
  moving the lens unit to an end point closer to the lens unit among the first and second end points of the maximum movement range by comparing the first distance and the second distance with each other.

16. The method of claim 11, wherein calculating the compensation value for the error further comprises:
  calculating at least one of a first compensation value for compensating for a drive signal applied to the lens unit and a second compensation value for compensating for the sensing signal sensed by the sensing unit.

17. The method of claim 16, wherein calculating the first compensation value further comprises:
  comparing the sensing signal sensed by the sensing unit with the predetermined reference signal to check whether or not there is an error, and
  when the error is checked, calculating the first compensation value for the error and storing the calculated first compensation value.

18. The method of claim 17, wherein the first compensation value for the error is calculated only when the checked error does not belong to a predetermined error range.

19. The method of claim 16, wherein calculating the second compensation value further comprises:
  compensating for the drive signal applied to the lens unit based on the calculated first compensation value,
  applying the compensated drive signal to the lens unit, configured to check whether or not there is an additional error by comparing the sensing signal sensed by the sensing unit with the predetermined reference signal,
  when the additional error is checked, calculating the second compensation value for the additional error, and
  storing the calculated second compensation value.

20. The method of claim 16, wherein compensating for the focus position of the lens unit further comprises:
  moving the lens unit to a focus position by compensating for the drive signal applied to the lens unit based on the calculated first compensation value, and
  compensating for the focus position of the lens unit based on the calculated second compensation value.

* * * * *